US012651556B2

(12) United States Patent
An et al.

(10) Patent No.: US 12,651,556 B2
(45) Date of Patent: Jun. 9, 2026

(54) DISPLAY PANEL

(71) Applicant: LG DISPLAY CO., LTD., Seoul (KR)

(72) Inventors: Sung Bae An, Paju-si (KR); Su Hyeon Jo, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/937,873

(22) Filed: Nov. 5, 2024

(65) Prior Publication Data

US 2025/0273128 A1 Aug. 28, 2025

(30) Foreign Application Priority Data

Feb. 28, 2024 (KR) ........................ 10-2024-0028679

(51) Int. Cl.
| | |
|---|---|
| *G09G 3/32* | (2016.01) |
| *H10D 86/40* | (2025.01) |
| *H10D 86/60* | (2025.01) |
| *H10H 20/857* | (2025.01) |
| *H10W 90/00* | (2026.01) |

(52) U.S. Cl.
CPC ............. *G09G 3/32* (2013.01); *H10D 86/441* (2025.01); *H10D 86/60* (2025.01); *H10H 20/857* (2025.01); *H10W 90/00* (2026.01); *G09G 2330/02* (2013.01); *G09G 2330/10* (2013.01)

(58) Field of Classification Search
CPC .. G09G 3/32; G09G 2330/02; G09G 2330/10; G09G 3/006; G09G 3/3233; H10D 86/441; H10D 86/60; H10H 20/857; H10H 20/852; H01L 25/167
USPC ............................................... 345/82; 362/84
See application file for complete search history.

(56) References Cited

U.S. PATENT DOCUMENTS

| | | | | |
|---|---|---|---|---|
| 2009/0315874 | A1* | 12/2009 | Kim ..................... | G09G 3/3233 |
| | | | | 345/82 |
| 2015/0331285 | A1* | 11/2015 | Bibl ..................... | H10H 20/852 |
| | | | | 362/84 |
| 2018/0211582 | A1 | 7/2018 | Sakariya et al. | |
| 2019/0385513 | A1* | 12/2019 | Iguchi ................... | G09G 3/006 |
| 2022/0139300 | A1 | 5/2022 | Yokoyama et al. | |
| 2023/0197005 | A1 | 6/2023 | Kim et al. | |

FOREIGN PATENT DOCUMENTS

| | | |
|---|---|---|
| KR | 10-2013-0116126 A | 10/2013 |
| KR | 10-2018-0004247 A | 1/2018 |
| KR | 10-2023-0094693 A | 6/2023 |
| WO | 2020/174879 A1 | 9/2020 |

\* cited by examiner

*Primary Examiner* — Abdul-Samad A Adediran
(74) *Attorney, Agent, or Firm* — Morgan, Lewis & Bockius LLP

(57) ABSTRACT

The present embodiment relates to a display panel, and more particularly, to a display panel, which can be used without a separate repair process in case that a defect occurs in a micro light-emitting diode (LED) in a transfer process, and can reduce areas occupied by driving circuits and the number of components.

13 Claims, 19 Drawing Sheets

DISPLAY PANEL

CROSS-REFERENCE TO RELATED APPLICATION

This application claims the benefit of and priority to Korean Patent Application No. 10-2024-0028679, filed on Feb. 28, 2024, the entire contents of which are incorporated herein by reference for all purposes.

BACKGROUND

1. Technical Field

The present embodiment relates to a display panel.

2. Description of the Related Art

With the progress of informatization, various display devices have been released. For example, a liquid crystal display (LCD) and an organic light-emitting diode (OLED) display device have been released.

Recently, a display device, in which a light-emitting diode (LED) that is an inorganic light-emitting element is used as a light-emitting element of a pixel, is attracting attention as a next-generation display device.

As an example of an inorganic light-emitting display device, there is a micro LED display device using a micro LED as a light-emitting element. Here, the micro LED may mean an LED having a size that is equal to or smaller than 100 μm.

The description of the related art should not be assumed to be prior art merely because it is mentioned in or associated with this section. The description of the related art includes information that describes one or more aspects of the subject technology, and the description in this section does not limit the invention.

SUMMARY

One or more aspects of the present disclosure provide a display panel, which can be used without a separate repair process in case that a defect occurs in a micro LED in a transfer process, and can reduce areas occupied by driving circuits and the number of components.

Aspects of the present disclosure are not limited to the above-described aspects, and other unmentioned aspects will be clearly understood by those skilled in the art from the following description.

One or more aspects of the present disclosure provide a display panel, which includes: a plurality of main light-emitting elements each having a first electrode connected to a first line; a plurality of sub light-emitting elements each having a first electrode connected to a second line; a driving circuit configured to generate current for driving one or more of the plurality of main light-emitting elements and one or more of the plurality of sub light-emitting elements; and a switch circuit including a first switch element configured to selectively connect the driving circuit and the first line to each other and a second switch element configured to selectively connect the driving circuit and the second line to each other.

If the plurality of main light-emitting elements are normal, the first switch element may electrically connect the driving circuit and the first line to each other and may transfer the current to the first line, and if any one of the plurality of main light-emitting elements is defective, the second switch element may electrically connect the driving circuit and the second line to each other and may transfer the current to the second line at a driving time of the defective main light-emitting element.

The display panel may further include: a first power line configured to supply a driving voltage to the driving circuit; a second power line to which a cathode voltage that is lower than the driving voltage is applied; a non-driving power line to which a non-driving voltage that is set to be equal to or higher than the driving voltage is applied; a plurality of third switch elements configured to connect a second electrode of each of the main light-emitting elements to the second power line or to a non-driving voltage line; and a plurality of fourth switch elements configured to connect a second electrode of each of the sub light-emitting elements to the second power line or to the non-driving voltage line.

The plurality of third switch elements may comprise a third switch element and remaining third switch elements. In case that any one of the plurality of main light-emitting elements is driven by the current in a state where the first switch element electrically connects the driving circuit and the first line to each other, the third switch element disposed on the any one of the plurality of main light-emitting elements may connect the second electrode of the any one of the plurality of main light-emitting elements to the second power line, and the remaining third switch elements disposed on the remaining main light-emitting elements may connect the second electrode of each of the remaining main light-emitting elements to the non-driving voltage line.

A voltage obtained by subtracting the driving voltage from the non-driving voltage may be a voltage that is lower than a threshold voltage of each of the plurality of main light-emitting elements.

The plurality of fourth switch elements may comprise a fourth switch element and remaining fourth switch elements. In case that any one of the plurality of sub light-emitting elements is driven by the current in a state where the second switch element electrically connects the driving circuit and the second line to each other, the fourth switch element disposed on the any one of the plurality of sub light-emitting elements may connect the second electrode of the any one of the plurality of sub light-emitting elements to the second power line, and the remaining fourth switch elements disposed on the remaining sub light-emitting elements may connect the second electrode of each of the remaining sub light-emitting elements to the non-driving voltage line.

A voltage obtained by subtracting the driving voltage from the non-driving voltage may be a voltage that is lower than a threshold voltage of each of the plurality of sub light-emitting elements.

The plurality of main light-emitting elements and the plurality of sub light-emitting elements may be micro light-emitting diodes (LEDs) that emit light of a same color wavelength.

According to the present embodiment as described above, since the sub light-emitting element that substitutes for the main light-emitting element when the main light-emitting element is defective is disposed on the display panel, it is possible to use the display panel without the separate repair process.

Further, since one driving circuit drives the plurality of light-emitting elements, the area occupied by the driving circuits and the number of components can be reduced.

The diverse and useful advantages and effects of the embodiment are not limited to the above-described contents, and will be able to be understood more easily in the process of describing specific embodiments.

Additional features, advantages, and aspects of the present disclosure are set forth in part in the description that follows and in part will become apparent from the present disclosure or may be learned by practice of the inventive concepts provided herein. Other features, advantages, and aspects of the present disclosure may be realized and attained by the descriptions provided in the present disclosure, or derivable therefrom, and the claims hereof as well as the drawings. It is intended that all such features, advantages, and aspects be included within this description, be within the scope of the present disclosure, and be protected by the following claims. Nothing in this section should be taken as a limitation on those claims. Further aspects and advantages are discussed below in conjunction with embodiments of the present disclosure.

It is to be understood that both the foregoing description and the following description of the present disclosure are examples, and are intended to provide further explanation of the disclosure as claimed.

BRIEF DESCRIPTION OF THE DRAWINGS

The accompanying drawings, which are included to provide a further understanding of the present disclosure, are incorporated in and constitute a part of this present disclosure, illustrate aspects and embodiments of the present disclosure, and together with the description serve to explain principles and examples of the disclosure. In the drawings:

FIG. 12 is a diagram explaining the configuration of a display panel according to a second embodiment of the present disclosure;

FIG. 16 is a diagram explaining the configuration of a display panel according to a third embodiment of the present disclosure;

Figure 1:
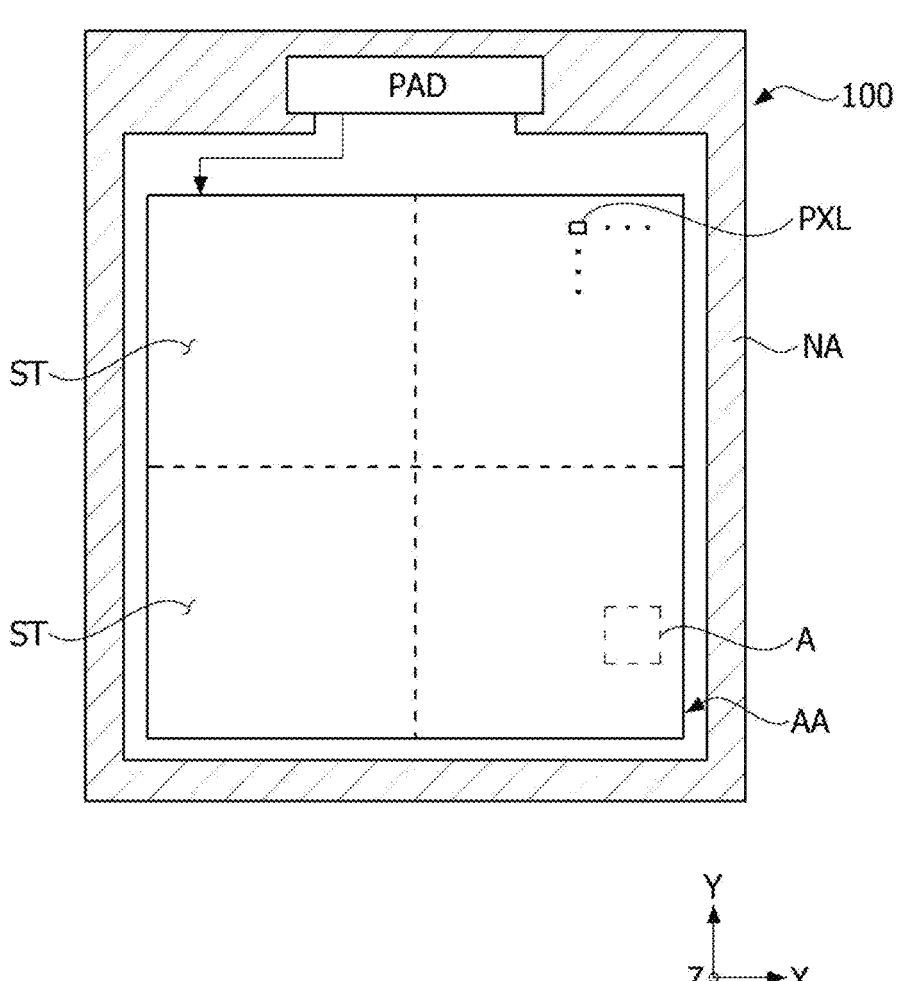
FIG. 1 is a view showing a display device according to an embodiment of the present disclosure.

Throughout the drawings and the detailed description, unless otherwise described, the same drawing reference numerals should be understood to refer to the same elements, features, and structures. The sizes, lengths, and thicknesses of layers, regions and elements, and depiction thereof may be exaggerated for clarity, illustration, and/or convenience.

DETAILED DESCRIPTION

Advantages and features of the present disclosure, and the method for achieving them will be apparent from the embodiments described below in detail together with the accompanying drawings. The present disclosure is not limited to the embodiments disclosed below, but will be carried out in various forms, these embodiments are provided only to complete the present disclosure and to fully inform the scope of the disclosure to those of ordinary skill in the art to which the present disclosure pertains, and the present disclosure is defined only by the scope of the claims.

The shapes, sizes, ratios, angles, and numbers shown in the drawings to illustrate the embodiments of the present disclosure are examples, and thus the present disclosure is not limited to the matters illustrated. The same reference symbols refer to the same elements throughout the disclosure. In addition, in the description of the present disclosure, when it is determined that a detailed description of a related known technology may unnecessarily obscure the subject matter of the present disclosure, a detailed description thereof is omitted.

In the present disclosure, when "include," "comprise," "have," "consist of," and the like are used, other parts may be added unless "only" is used. The singular forms are intended to include the plural forms as well, unless the context clearly indicates otherwise. For example, an element may be one or more elements. An element may include a plurality of elements. The word "exemplary" is used to mean serving as an example or illustration. Embodiments are example embodiments. Aspects are example aspects. In one or more implementations, "embodiments," "examples," "aspects," and the like should not be construed to be preferred or advantageous over other implementations. An embodiment, an example, an example embodiment, an aspect, or the like may refer to one or more embodiments, one or more examples, one or more example embodiments, one or more aspects, or the like, unless stated otherwise. Further, the term "may" encompasses all the meanings of the term "can."

In interpreting the components, the components are interpreted as including an error range even if there is no explicit description.

When the positional relationship or an interconnection relationship of two parts is described by, for example, "on," "above," "under," "next to," "connect or couple," "crossing or intersecting," and the like, one or more other parts may be placed between the two parts unless "immediately" or "directly" is used.

When temporal antecedent and consequent relationships are described as "after," "following," "next to," "before," etc., they may not be continuous on a time axis unless "immediately" or "directly" is used.

To distinguish components, first, second, etc., may be used before the names of the same components, but the function or structure thereof is not limited by such ordinal numbering or component name. For ease of description, the ordinal number placed before the names of the same components may be different between embodiments.

The following embodiments may be partially or fully combined or combined with each other, and technically different interlocking and driving are possible. Each of the embodiments may be implemented independently of each other or may be implemented together in an association relationship.

Hereinafter, various embodiments of the present disclosure will be described in detail with reference to the accompanying drawings.

A display device according to an embodiment of the present disclosure includes a display area on which an image is displayed or a display panel on which a screen is disposed, and a driving circuit that drives pixels of the display panel. The display area includes a pixel area on which the pixels are disposed. The pixel area includes a plurality of emission areas. A light-emitting element is disposed in each of the emission areas. The driving circuit may be built in the display panel.

Figure 2:
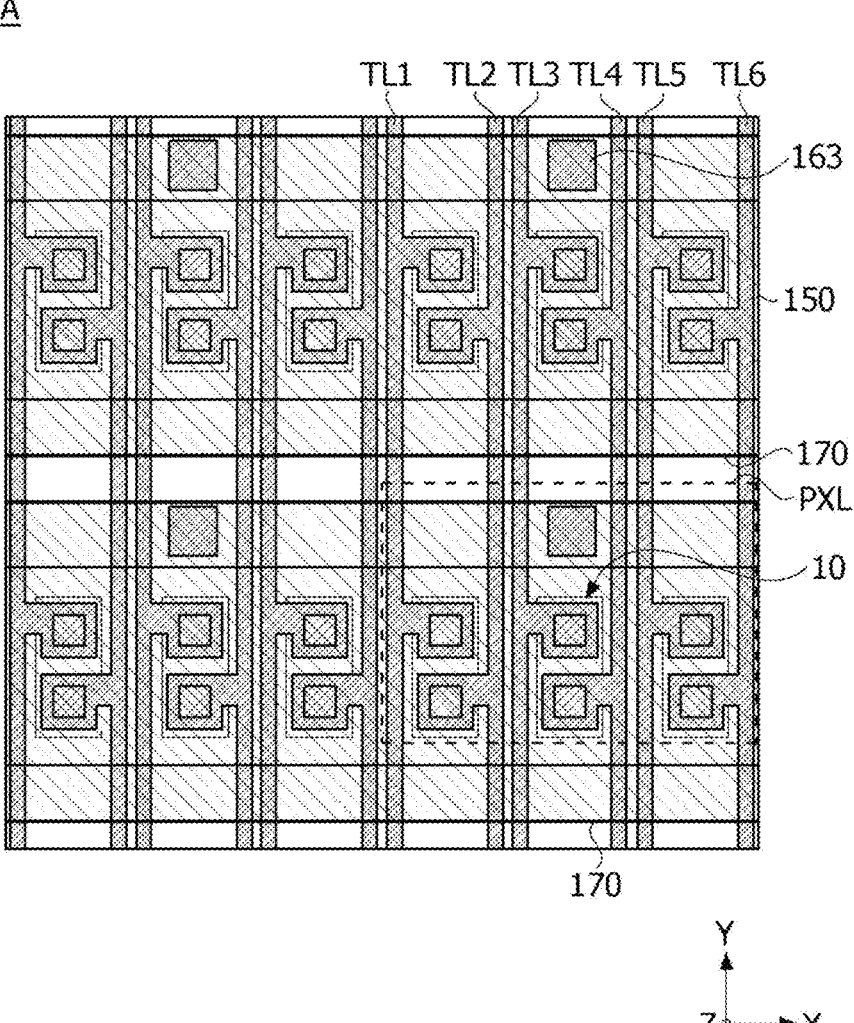
FIG. 2 is an enlarged view showing an area A of FIG. 1.
Figure 3:
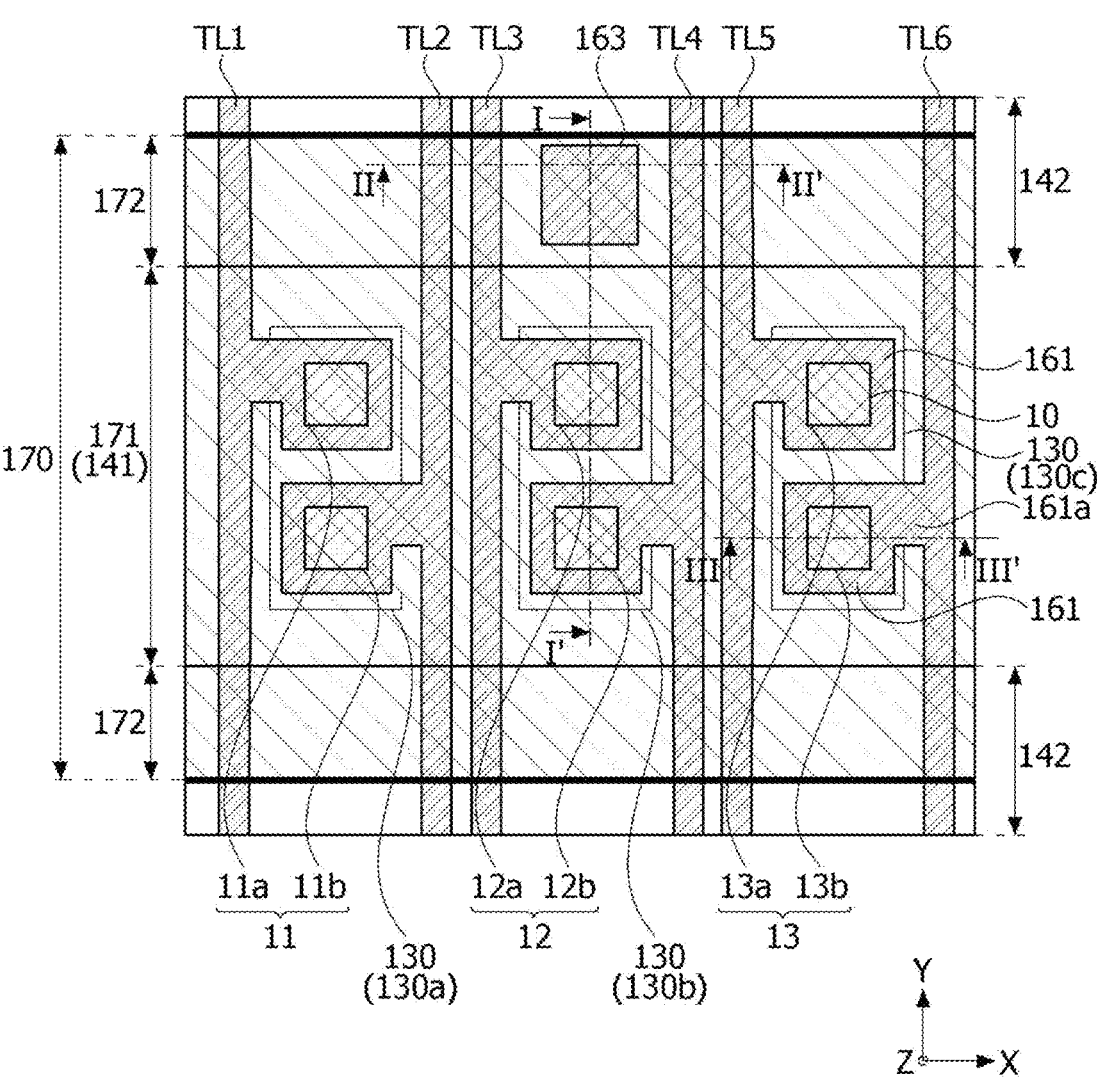
FIG. 3 is a view showing a partial area of a pixel.

FIG. 1 is a view showing a display device according to an embodiment of the present disclosure. FIG. 2 is an enlarged view showing an area A of FIG. 1. FIG. 3 is a view showing a partial area of a pixel.

Referring to FIGS. 1 and 2, a display device 100 according to an embodiment of the present disclosure includes a display panel on which an input image is visually represented. The display panel may include a display area AA on which the image is displayed and a non-display area NA on which the image is not displayed. In the non-display area NA, various kinds of wires and driving circuits may be mounted, and a pad portion PAD to which an integrated circuit and a printed circuit are connected may be disposed.

A plurality of light-emitting elements 10 which are disposed in the display area AA and form a pixel PXL may be inorganic light-emitting elements of a micro size. The inorganic light-emitting element may be grown on a silicon wafer, and then may be attached to the display panel through a transfer process.

The transfer process of the light-emitting element 10 may be performed for each pre-partitioned area. Although FIG. 1 provides an example in which the display area AA is partitioned into 9 transfer areas ST, the size of the transfer area or the number of partitions are not limited thereto. The transfer process may be performed sequentially or simultaneously in the first transfer area ST to the ninth transfer area ST. Onto the transfer area ST, a blue light-emitting element 10, a green light-emitting element 10, and a red light-emitting element 10 may be sequentially transferred.

In the non-display area NA, a data driving circuit or a gate driving circuit may be disposed, and wires for supplying a control signal for controlling such driving circuits may be disposed. Here, the control signal includes various kinds of timing signals including a clock signal, an input data enable signal, and synchronization signals, and may be received through a pad portion PAD.

Pixels PXL may be driven by a driving circuit. The driving circuit may drive a plurality of pixels by receiving a driving voltage, an image signal (digital signal), and a synchronization signal that is synchronized with the image signal, and by outputting an anode voltage and a cathode voltage of the light-emitting element 10. The driving voltage may be a high-potential voltage EVDD. The cathode voltage may be a low-potential voltage EVSS that is commonly applied to the pixels. The anode voltage may be a voltage corresponding to a pixel data value of the image signal. The driving circuit may be disposed in the non-display area NA or may be disposed below the display area AA.

Each of the pixels PXL may include a plurality of sub-pixels having different colors. For example, each of the plurality of pixels may include a red sub-pixel on which a light-emitting element 10 that emits light of a red wavelength is disposed, a green sub-pixel on which a light-emitting element 10 that emits light of a green wavelength is disposed, and a blue sub-pixel on which a light-emitting element 10 that emits light of a blue wavelength is disposed. The plurality of pixels may further include a white pixel.

Referring to FIGS. 2 to 3, the plurality of pixels PXL may be continuously disposed in a first direction (X-axis direction) and in a second direction (Y-axis direction). In the pixel of the display area AA, a plurality of sub-pixels of the same color may be disposed. For example, each of the plurality of pixels may include: a first red sub-pixel on which a (1-1)th light-emitting element 11a that emits light of a red wavelength is disposed, a second red sub-pixel on which a (1-2)th light-emitting element 11b that emits light of a red wavelength is disposed, a first green sub-pixel on which a (2-1)th light-emitting element 12a that emits light of a green wavelength is disposed, a second green sub-pixel on which a (2-2)th light-emitting element 12b that emits light of a green wavelength is disposed, a first blue sub-pixel on which a (3-1)th light-emitting element 13a that emits light of a blue wavelength is disposed, and a second blue sub-pixel on which a (3-2)th light-emitting element 13b that emits light of a blue wavelength is disposed. The (1-1)th light-emitting element 11a, the (2-1)th light-emitting element 12a, and the (3-1)th light-emitting element 13a may be interpreted as main light-emitting elements. The (1-2)th light-emitting element 11b, the (2-2)th light-emitting element 12b, and the (3-2)th light-emitting element 13b may be interpreted as sub light-emitting elements.

Since one sub-pixel may include at least one light-emitting element, if one light-emitting element is defective, the luminance of the sub-pixel may be adjusted by increasing the luminance of another light-emitting element. However, the luminance adjustment of the sub-pixel is not limited thereto, and one sub-pixel may include only one light-emitting element.

A plurality of first electrodes 161 may be disposed on the lower portion of each of the light-emitting elements 10, and may be selectively connected to a plurality of signal wires TL1 to TL6 by an extension portion. A high-potential voltage may be applied to the driving circuit through the signal wires Tl1 to TL6. The signal wires TL1 to TL6 and the first electrodes 161 may be formed as an integrated electrode pattern in an electrode pattern process.

In one or more examples, the first signal wire TL1 may be connected to an anode electrode of the first red sub-pixel, and the second signal wire TL2 may be connected to an anode electrode of the second red sub-pixel. The third signal wire TL3 may be connected to an anode electrode of the first green sub-pixel, and the fourth signal wire TL4 may be connected to an anode electrode of the second green sub-pixel. The fifth signal wire TL5 may be connected to an anode electrode of the first blue sub-pixel, and the sixth signal wire TL6 may be connected to an anode electrode of the second blue sub-pixel. In case that one sub-pixel includes only one light-emitting element, the number of signal wires TL may be reduced by half.

A second electrode 170 may be a cathode electrode which is disposed in each row and applies a cathode voltage to the light-emitting elements 10 continuously disposed in a first direction (X-axis direction). A plurality of second electrodes 170 may be disposed to be spaced apart from each other in a second direction (Y-axis direction). The plurality of second electrodes 170 may be connected to the cathode voltage through contact electrodes 163. The plurality of second electrodes 170 may be electrically connected to the contact electrodes 163. However, the electrical connection to the contact electrodes 163 is not limited thereto, and the second electrode 170 is not divided into the plurality of second electrodes 170, but may be constituted as one electrode layer so as to function as a common electrode.

Figure 4:
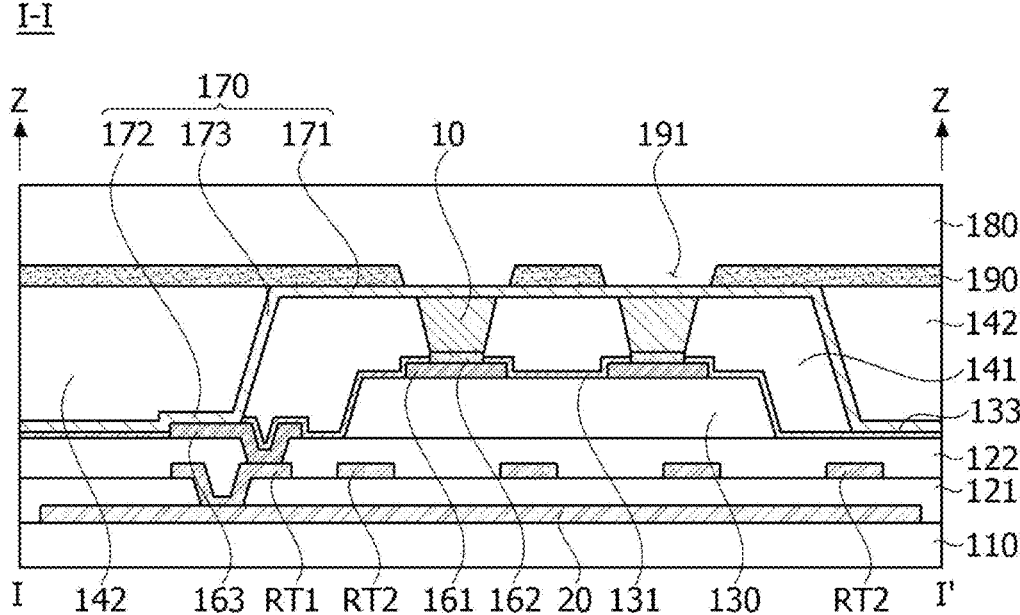
FIG. 4 is a cross-sectional view taken along line I-I' in FIG. 3.
Figure 5:
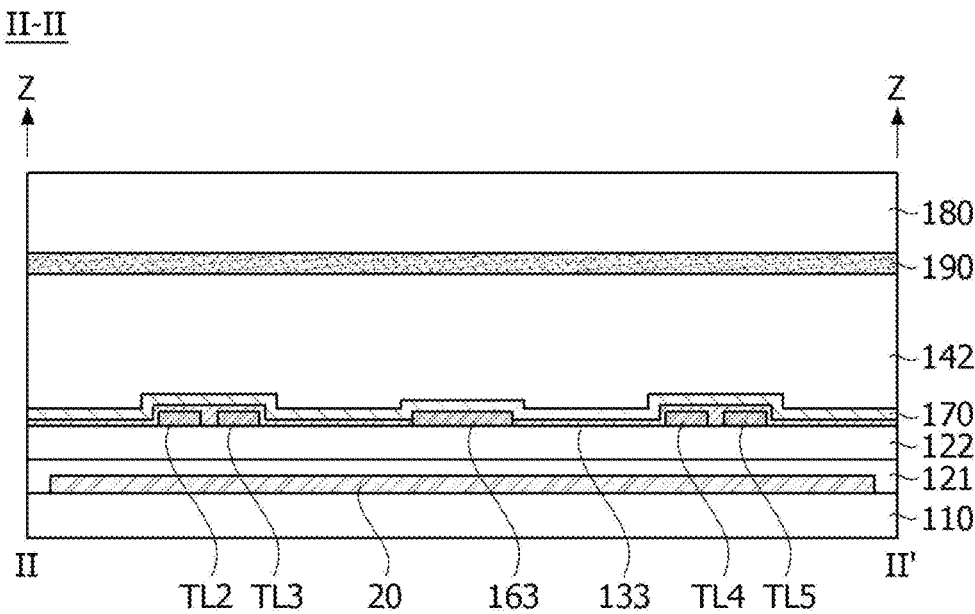
FIG. 5 is a cross-sectional view taken along line II-II' in FIG. 3.
Figure 6:
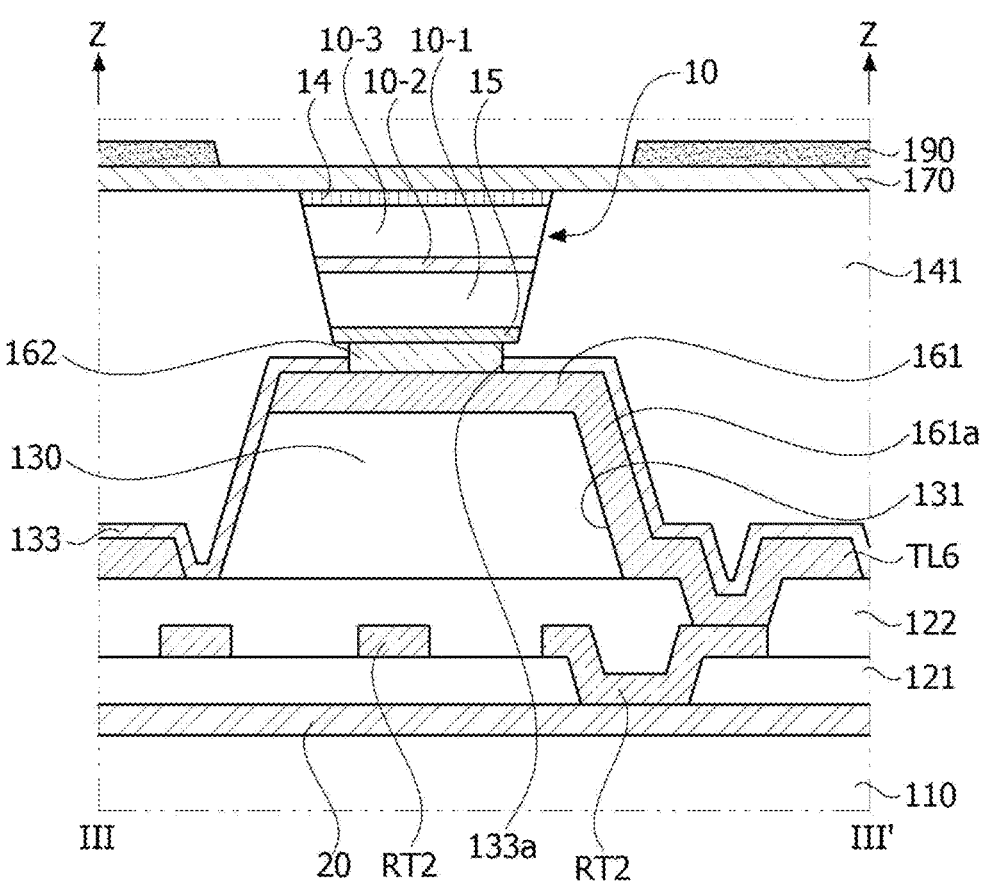
FIG. 6 is a cross-sectional view taken along line III-III' in FIG. 3.
Figure 7:
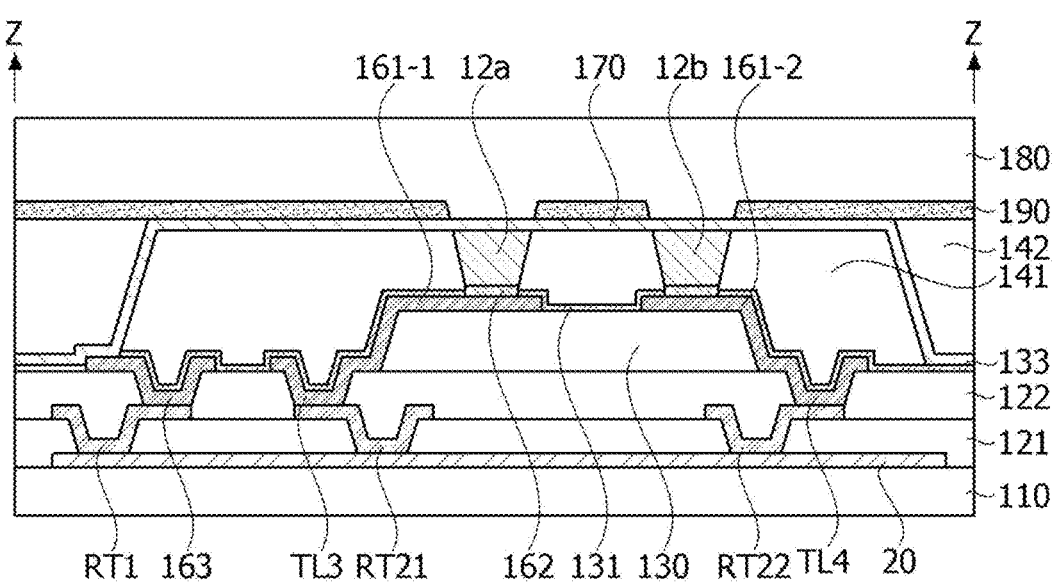
FIG. 7 is a cross-sectional view showing an example in which a main light-emitting element and a sub light-emitting element are electrically connected to a pixel driving circuit.

FIG. 4 is a cross-sectional view taken along line I-I' in FIG. 3. FIG. 5 is a cross-sectional view taken along line II-II' in FIG. 3. FIG. 6 is a cross-sectional view taken along line III-III' in FIG. 3. FIG. 7 is a cross-sectional view showing an example in which a main light-emitting element and a sub light-emitting element are electrically connected to a driving circuit.

Referring to FIGS. 3 to 5, a display device according to an embodiment includes a plurality of first electrodes 161 and contact electrodes 163 disposed on a substrate 110, a plurality of light-emitting elements 10 disposed on the plurality of first electrodes 161, a first optical layer 141 disposed between the plurality of light-emitting elements 10, and the second electrode 170 disposed on the plurality of light-emitting elements 10.

The substrate 110 may be made of plastic having flexibility. For example, the substrate 110 may be manufactured as a single-layer or multilayer substrate of a material selected among polyimide, polyethylene terephthalate, polyethylene naphthalate, polycarbonate, polyethersulfone, polyarylate, polysulfone, and cyclic-olefin copolymer, but is not limited thereto. For example, the substrate 110 may be a ceramic substrate or a glass substrate.

On the substrate 110, a driving circuit 20 may be disposed in the display area AA. The driving circuit 20 may include a plurality of thin film transistors using an amorphous silicon semiconductor, polycrystalline silicon semiconductor, or oxide semiconductor.

The driving circuit 20 may include at least one driving thin film transistor, at least one switching thin film transistor, and at least one storage capacitor. In case that the driving circuit 20 includes a plurality of thin film transistors, they may be formed on the substrate 110 through a thin film transistor (TFT) manufacturing process. In an embodiment, the driving circuit 20 may be a general term for the plurality of thin film transistors that are electrically connected to the light-emitting elements 10.

The driving circuit 20 may be a micro driver that is manufactured by using a metal-oxide-silicon field effect transistor (MOSFET) manufacturing process on a monocrystalline semiconductor substrate 110. The micro driver may include a plurality of driving circuits, and may drive a plurality of sub-pixels. In case that the driving circuit 20 is implemented by the micro driver, an adhesive layer may be disposed on the substrate 110, and then the micro driver may be mounted on the adhesive layer through a transfer process.

On the substrate 110, a buffer layer 121 that covers the driving circuit 20 may be disposed. The buffer layer 121 may be made of an organic insulating material, for example, photosensitive photo acryl or photosensitive polyimide, but is not limited thereto.

The buffer layer 121 may be used by stacking an inorganic insulating material, for example, silicon nitride (SiNx) or silicon oxide (SiO2), in multiple layers, and may be used by stacking an organic insulating material and an inorganic insulating material in multiple layers.

An insulating layer 122 may be disposed on the buffer layer 121. The insulating layer 122 may be made of an organic insulating material, for example, photosensitive photo acryl or photosensitive polyimide, but is not limited thereto. Connection wires RT1 and RT2 may be disposed on the buffer layer 121. The connection wires RT1 and RT2 may be connected to the corresponding signal wires TL1 to TL6, or may be connected to the signal wires TL1 to TL6. The connection wires RT1 and RT2 may include a plurality of wire patterns disposed on different layers with one or more insulating layers interposed therebetween. The wire patterns disposed on the different layers may be electrically connected to each other through contact holes penetrating the insulating layers.

On the insulating layer 122, a plurality of bank patterns 130 may be disposed. On each of the bank patterns 130, at least one light-emitting element 10 may be disposed. For example, a first light-emitting element 11 may be disposed on a first bank pattern 130, a second light-emitting element 12 may be disposed on a second bank pattern 130, and a third light-emitting element 13 may be disposed on a third bank pattern 130.

The bank pattern 130 may be made of an organic insulating material, for example, photosensitive photo acryl or photosensitive polyimide, but is not limited thereto. The bank pattern 130 may guide locations to which the light-emitting elements 10 are attached in the transfer process of the light-emitting elements 10. The bank pattern 130 may be omitted.

On the first electrode 161, a solder pattern 162 may be disposed. The solder pattern 162 may be made of indium (In), tin (Sn), or an alloy thereof, but is not limited thereto.

The plurality of light-emitting elements 10 may be mounted on the solder pattern 162. One pixel may include the light-emitting elements 10 of three kinds of colors. The first light-emitting element 11 may be a red light-emitting element, the second light-emitting element 12 may be a green light-emitting element, and the third light-emitting element 13 may be a blue light-emitting element. On each of the sub-pixels, two light-emitting elements may be mounted.

The first optical layer 141 may cover the plurality of light-emitting elements 10 and the bank patterns 130. Accordingly, the first optical layer 141 may cover between the plurality of light-emitting elements 10 and between the plurality of bank patterns 130. The first optical layer 141 may extend in the first direction X, may be spaced apart in the second direction Y, and may be separated between pixel rows.

The first optical layer 141 may include an organic insulating material on which fine metal particles such as titanium dioxide particles are dispersed. Light emitted from the plurality of light-emitting elements 10 may be scattered by the fine metal particles dispersed on the first optical layer 141, and may be emitted to outside.

The second electrode 170 may be disposed on the plurality of light-emitting elements 10. The second electrode 170 may be commonly connected to the plurality of pixels PXL. The second electrode 170 may be a thin electrode through which light is transmitted. The second electrode 170 may be made of a transparent electrode material, for example, indium tin oxide (ITO), but is not limited thereto.

The second electrode 170 may extend in the first direction (X-axis direction), and may be spaced apart in the second direction (Y-axis direction). The second electrode 170 may include a first area 171 disposed on an upper surface of the light-emitting element 10 and an upper surface of the first optical layer 141, a second area 172 that comes in contact with and is electrically connected to the contact electrode 163, and a third area 173 disposed on a side surface of the first optical layer 141 and connecting the first area 171 and the second area 172 to each other.

On a plane, the plurality of second electrodes 170 may overlap the first optical layer 141, respectively, and the second area 172 may cover an outside of the first optical layer 141.

A second optical layer 142 may be made of an organic insulating material that surrounds the first optical layer 141. The second optical layer 142 may be disposed on the insulating layer 122 together with the first optical layer 141. The first optical layer 141 and the second optical layer 142 may include the same material (e.g., siloxane). For example, the first optical layer 141 may be made of siloxane including titanium oxide (TiOx), and the second optical layer 142 may be siloxane that does not include the titanium oxide (TiOx). However, the materials of the first optical layer 141 and the second optical layer 142 are not limited thereto, and the first optical layer 141 and the second optical layer 142 may be formed of the same material, or may be formed of different materials.

According to an embodiment, since the second area 172 of the second electrode 170 is connected to the contact electrode 163 in a state where the second area 172 is formed entirely flat, an excessive stress is not concentrated on a point where the second area 172 is connected to the contact electrode 163. Accordingly, cracks can be effectively prevented from occurring on the second electrode 170.

The second optical layer 142 may cover the second area and the third area 173 of the second electrode 170. An upper surface of the second optical layer 142 and an upper surface of the first area 171 may form the same plane. That is, the first optical layer 141 and the second optical layer 142 may function as planarization layers. Due to this, there is no step on a surface on which a black matrix 190 is formed, and thus a pattern of the black matrix 190 can be easily formed on the first optical layer 141 and the second optical layer 142. However, the upper surfaces of the second optical layer 142 and the second electrode 170 are not limited thereto, and the upper surfaces thereof may have different heights.

The black matrix 190 may be made of an organic insulating material to which a black pigment is added. Under the black matrix 190, the second electrode 170 may come in contact with the contact electrode 163. Between the patterns of the black matrix 190, transmission holes 191 through which light from the light-emitting element 10 is emitted to the outside may be formed between the patterns of the black matrix 190. Through the black matrix 190, it is possible to improve the problem in that the light that is emitted from the neighboring light-emitting element 10 is mixed by the first optical layer 141.

A cover layer 180 may be made of an organic insulating material that covers the black matrix 190 and the second electrode 170. In FIG. 3, the configurations of the black matrix 190 and the cover layer 180 have been omitted.

The contact electrode 163 may be electrically connected to the first connection wire RT1, and the first connection wire RT1 may be connected to the driving circuit 20. Accordingly, a cathode voltage may be applied to the second electrode 170 through the contact electrode 163. The first electrode 161 may be electrically connected to the second connection wire RT2. This will be described later.

Referring to FIG. 5, the contact electrode 163 and the signal wires TL1 to TL6 may be disposed on the same plane. On lower portions of the contact electrode 163 and the signal wires TL1 to TL6, the driving circuit 20 may be disposed.

In case that the driving circuit 20 is the micro driver, a plurality of micro drivers may be disposed in the display panel.

A passivation layer 133 may expose the contact electrode 160 so that the contact electrode 163 and the second electrode 170 are electrically connected to each other. Further, the passivation layer 133 may insulate the signal wires TL2 to TL5 and the second electrode 170.

Referring to FIG. 6, a connection portion 161a of the first electrode 161 may extend to one side surface 131 of the bank pattern 130, and may be electrically connected to the connection wire RT2 disposed on the insulating layer 122.

The first electrode 161, the connection portion 161a, the signal wire TL, and/or the connection wires RT1 and RT2 may include a single-layer or multilayer metal layer selected among titanium (Ti), molybdenum (Mo), and aluminum (Al). The first electrode 161, the connection portion 161a, the signal wire TL, and/or the connection wires RT1 and RT2 may be formed as a multilayer structure including a first layer ML1, a second layer ML2, a third layer ML3, and a fourth layer ML4.

The first layer ML1 and the third layer ML3 may include titanium (Ti) or molybdenum (Mo). The second layer ML2 may include aluminum (Al). The fourth layer ML4 may include a transparent conductive oxide layer, such as indium tin oxide (ITO) or indium zinc oxide (IZO), having good adhesiveness to the solder pattern 162, corrosion resistance, and acid resistance.

The first layer ML1, the second layer ML2, the third layer ML3, and the fourth layer ML4 may be sequentially deposited, and then may be patterned by performing a photolithography process and an etching process.

The passivation layer 133 may be disposed on the first electrode 161 and the signal wire TL, and may include an opening hole 133a for exposing the solder pattern 162.

The light-emitting element 10 may include a first conductive semiconductor layer 10-1, an active layer 10-2 disposed on the first conductive semiconductor layer 10-1, and a second conductive semiconductor layer 10-3 disposed on the active layer 10-2. A first driving electrode 15 may be disposed on a lower portion of the first conductive semiconductor layer 10-1, and a second driving electrode 14 may be disposed on an upper portion of the second conductive semiconductor layer 10-3.

The light-emitting element 10 may be formed on a silicon wafer by using metal organic chemical vapor deposition (MOCVD), chemical vapor deposition (CVD), plasma-enhanced chemical vapor deposition (PECVD), molecular beam epitaxy (MBE), hydride vapor phase epitaxy (HVPE), sputtering, and the like.

The first conductive semiconductor layer 10-1 may be implemented by compound semiconductors of group III-V, group II-VI, and the like, and a first dopant may be doped. The first conductive semiconductor layer 10-1 may be formed of any one or more of a semiconductor material having a compositional formula of $Al_{x1}In_{y1}Ga_{(1-x1-y1)}N$ ($0 \leq x1 \leq 1$, $0 \leq y1 \leq 1$, $0 \leq x1+y1 \leq 1$), InAlGaN, AlGaAs, GaP, GaAs, GaAsP, and AlGaInP, but is not limited thereto. In case that the first dopant is an n-type dopant, such as Si, Ge, Sn, Se, Te, and the like, the first conductive semiconductor layer 10-1 may be an n-type nitride semiconductor layer. However, in case that the first dopant is a p-type dopant, the first conductive semiconductor layer 10-1 may be a p-type nitride semiconductor layer.

The active layer 10-2 is a layer in which electrons (or holes) being injected through the first conductive semiconductor layer 10-1 and holes (or electrons) being injected through the second conductive semiconductor layer 10-3 meet each other. The active layer 10-2 may be transitioned to a low energy level depending on recombination of the electrons and the holes, and thus may generate light having a corresponding wavelength.

The active layer 10-2 may have any one of a signal well structure, a multi-well structure, a single quantum well structure, a multi-quantum well (MQW) structure, a quantum dot structure, or a quantum wire structure, but the structure of the active layer 10-2 is not limited thereto. The active layer 10-2 may generate light of a visible light wavelength. For example, the active layer 10-2 may output light of any one wavelength of blue, green, and red.

The second conductive semiconductor layer 10-3 may be disposed on the active layer 10-2. The second conductive semiconductor layer 10-3 may be implemented by compound semiconductors of group III-V, group II-VI, and the like, and a second dopant may be doped. The second conductive semiconductor layer 10-3 may be formed of a semiconductor material having a compositional formula of $Inx2Aly2Ga1-x2-y2N$ ($0≤x2≤1$, $0≤y2≤1$, $0≤x2+y2≤1$), or a material selected from AlInN, AlGaAs, GaP, GaAs, GaAsP, and AlGaInP. In case that the second dopant is a p-type dopant, such as Mg, Zn, Ca, Sr, Ba, and the like, the second conductive semiconductor layer 10-3 doped with the second dopant may be a p-type semiconductor layer. In case that the second dopant is an n-type dopant, the second conductive semiconductor layer 10-3 may be an n-type nitride semiconductor layer.

On a side surface and a lower portion of the light-emitting element 10, a reflective layer 16 may be disposed. The reflective layer 16 may have a structure in which a reflective material is dispersed on a resin layer, but is not limited thereto. For example, the reflective layer 16 may be produced by a reflector of various structures. The light emitted from the active layer 10-2 by the reflective layer 16 may be reflected upward, and thus the light extraction efficiency may be increased.

In an embodiment, although a vertical structure in which driving electrodes 14 and 15 are disposed on an upper portion and a lower portion of a light-emitting structure has been described, the light-emitting element may have a lateral structure or a flip chip structure in addition to the vertical structure.

Referring to FIG. 7, a main light-emitting element 12a and a sub light-emitting element 12b of a sub-pixel may be disposed on a bank pattern 130. The second light-emitting element 12 will be described as one or more examples. A (1-1)th electrode 161-1 connected to the main light-emitting element 12a may extend to one side surface of the bank pattern 130, and may be electrically connected to a (2-1)th connection wire RT21 disposed on the lower portion thereof. A (1-2)th electrode 161-2 connected to the sub light-emitting element 12b may extend to the other side surface of the bank pattern 130, and may be electrically connected to a (2-2)th connection wire RT22 disposed on the lower portion thereof.

The driving circuit 20 may apply an anode voltage to the main light-emitting element 12a by the (2-1)th connection wire RT21, and apply an anode voltage to the sub light-emitting element 12b by the (2-2)th connection wire RT22. The driving circuit 20 may apply a cathode voltage to the main light-emitting element 12a and the sub light-emitting element 12b through the first connection wire RT1 and the second electrode 170.

In case that the main light-emitting element 12a is normal, the driving circuit 20 may drive only the main light-emitting element 120 to adjust luminance. If the main light-emitting element 12a is defective, the driving circuit 20 may drive only the sub light-emitting element 12b to adjust the luminance.

Figure 8:
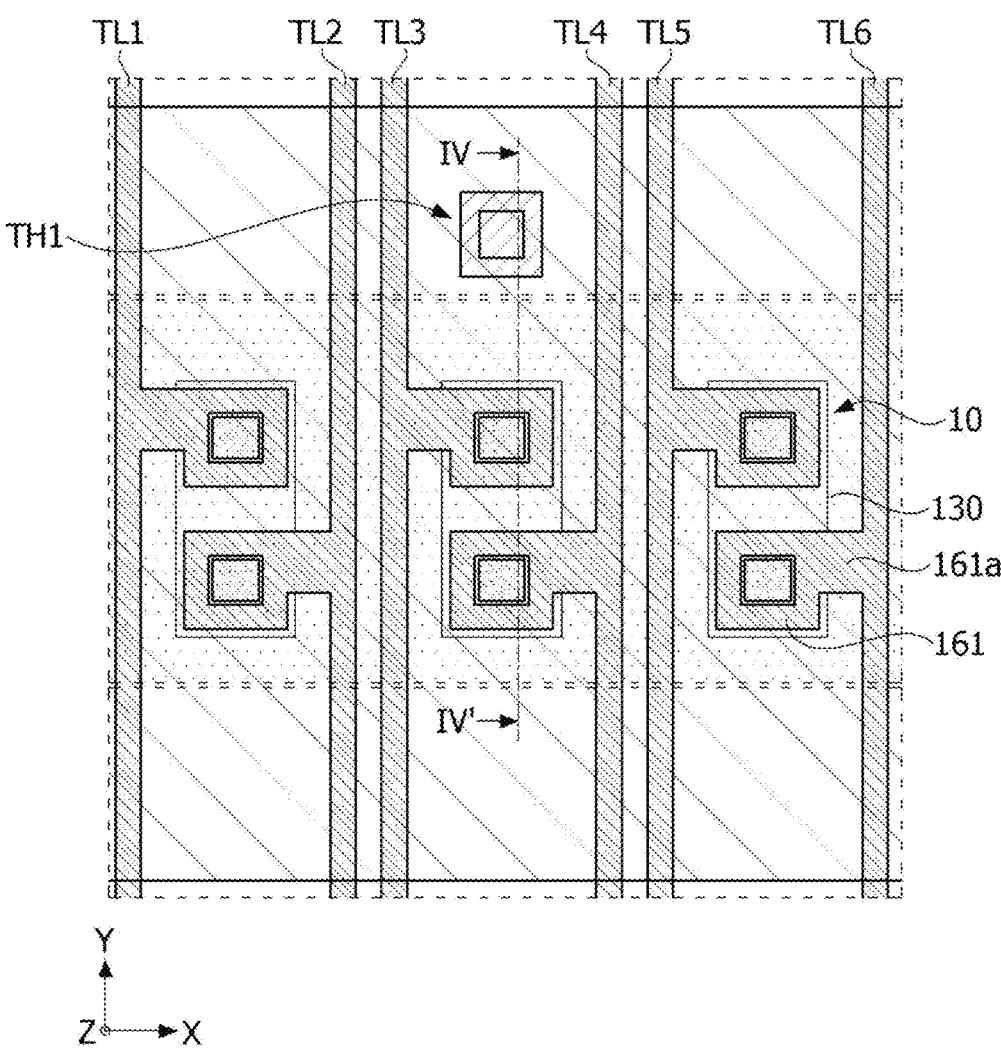
FIG. 8 is a view showing a display device according to another embodiment of the present disclosure.
Figure 9:
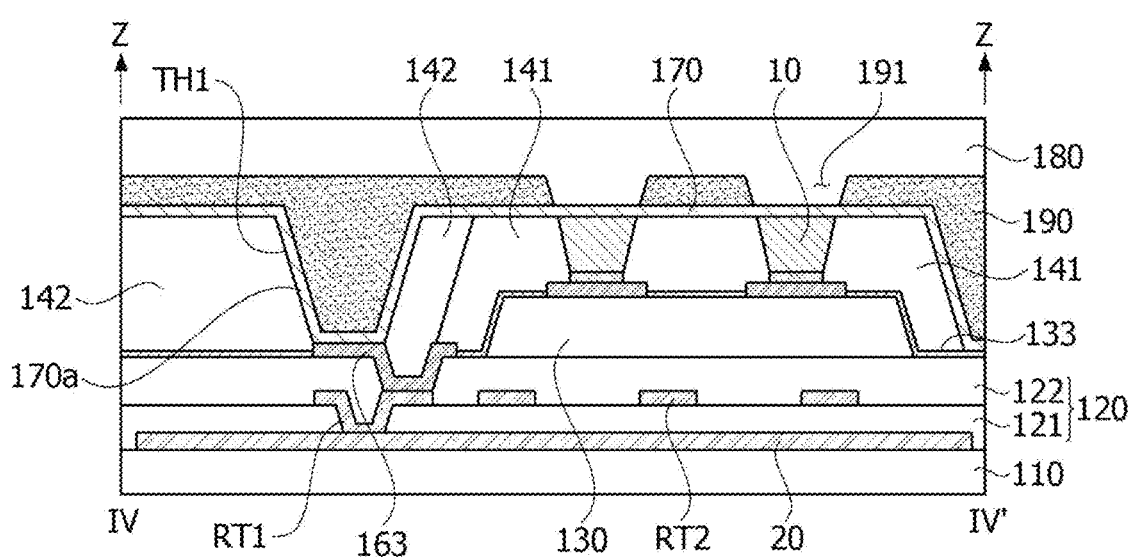
FIG. 9 is a cross-sectional view taken along line IV-IV' in FIG. 8.

FIG. 8 is a view showing a display device according to another embodiment of the present disclosure. FIG. 9 is a cross-sectional view taken along line IV-IV' in FIG. 8.

Referring to FIGS. 8 and 9, the second electrode 170 may be electrically connected to the contact electrode 163 through a contact hole TH1 formed on the second optical layer 142. The second optical layer 142 may include the contact hole TH1 that exposes the contact electrode 163. The second electrode 170 may be inserted into the contact hole TH1 of the second optical layer 142, and may come in contact with the upper surface of the contact electrode 163. The contact hole TH1 may be formed in an outer area of the pixel.

Figure 10:
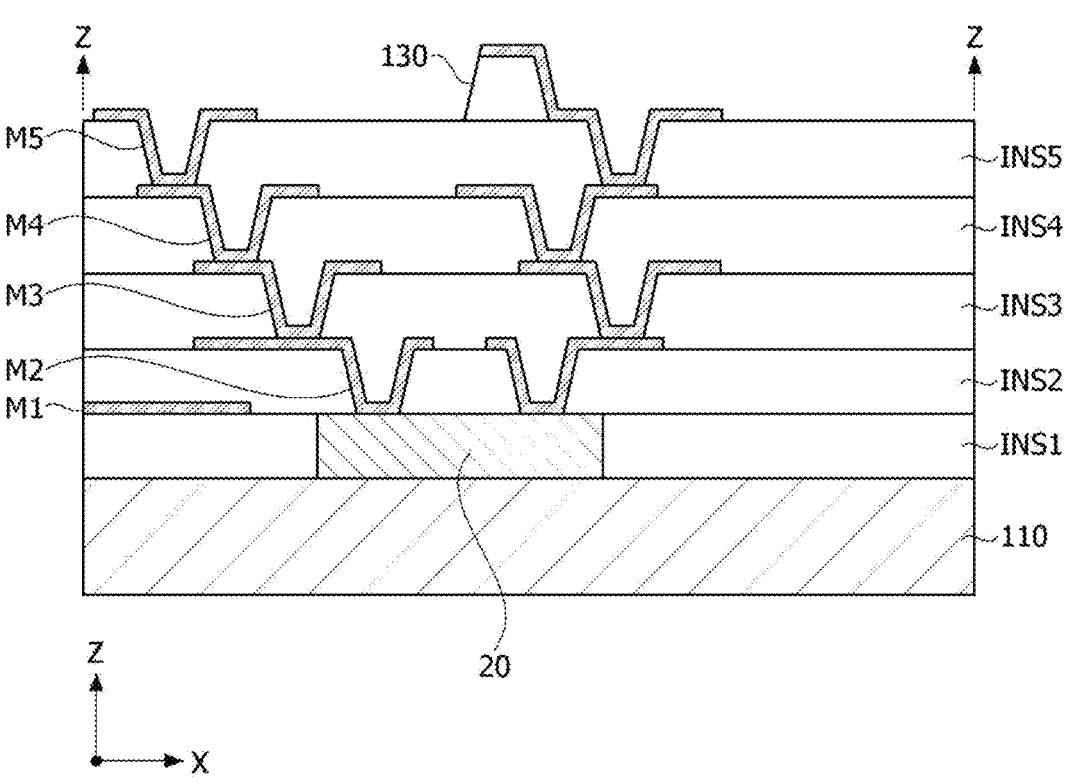
FIG. 10 is a cross-sectional view of a display panel schematically showing an example of multilayer wiring patterns.

FIG. 10 is a cross-sectional view of a display panel schematically showing an example of multilayer wire patterns that can be applied to an embodiment of the present disclosure.

Referring to FIG. 10, first to fifth insulating layers INS1 to INS5 may be stacked on the substrate 110. Wires of the display panel may include a plurality of wire patterns disposed on different layers.

At least one driving circuit 20 may be disposed on the substrate 110. At least a portion of the driving circuit 20 may be buried in the first insulating layer INS1. The first wire pattern M1 may be disposed on the first insulating layer INS1. The first insulating layer INS1 may be composed of a single or a plurality of insulating layers. The second insulating layer INS2 includes contact holes that expose output terminals of the driving circuit 20 and/or the first wire pattern M1. The second wire pattern M2 may be disposed on the second insulating layer INS2. A portion of the first wire pattern M1 may come in contact with the output terminals of the driving circuit 20 and/or the first wire pattern M1 through contact holes that penetrate the second insulating layer INS2. The third insulating layer INS3 may include contact holes that expose a portion of the second wire pattern M2. The third wire pattern M3 may be disposed on the third insulating layer INS3. A portion of the third wire pattern M3 may come in contact with the second wire pattern M2 through contact holes that penetrate the third insulating layer INS3.

The fourth insulating layer INS4 may include contact holes that expose a portion of the third wire pattern M3. The fourth wire pattern M4 may be disposed on the fourth insulating layer INS4. A portion of the fourth wire pattern M4 may come in contact with the third wire pattern M3 through contact holes that penetrate the fourth insulating layer INS4. The fifth insulating layer INS5 may include contact holes that expose a portion of the fourth wire pattern M4. The fifth wire pattern M5 may be disposed on the fifth insulating layer INS5. A portion of the fifth wire pattern M5 may come in contact with the fourth wire pattern M4 through contact holes that penetrate the fifth insulating layer INS5. The fifth wire pattern M5 may include a metal pattern that is electrically connected to the first electrode of the light-emitting element and a metal pattern that is connected to the second electrode of the light-emitting element.

Hereinafter, the circuit configuration of a display panel, which may be used without a separate repair process in case that a defect occurs in a micro LED in a transfer process and may be capable of reducing areas occupied by driving circuits and the number of components, will be described.

Figure 11:
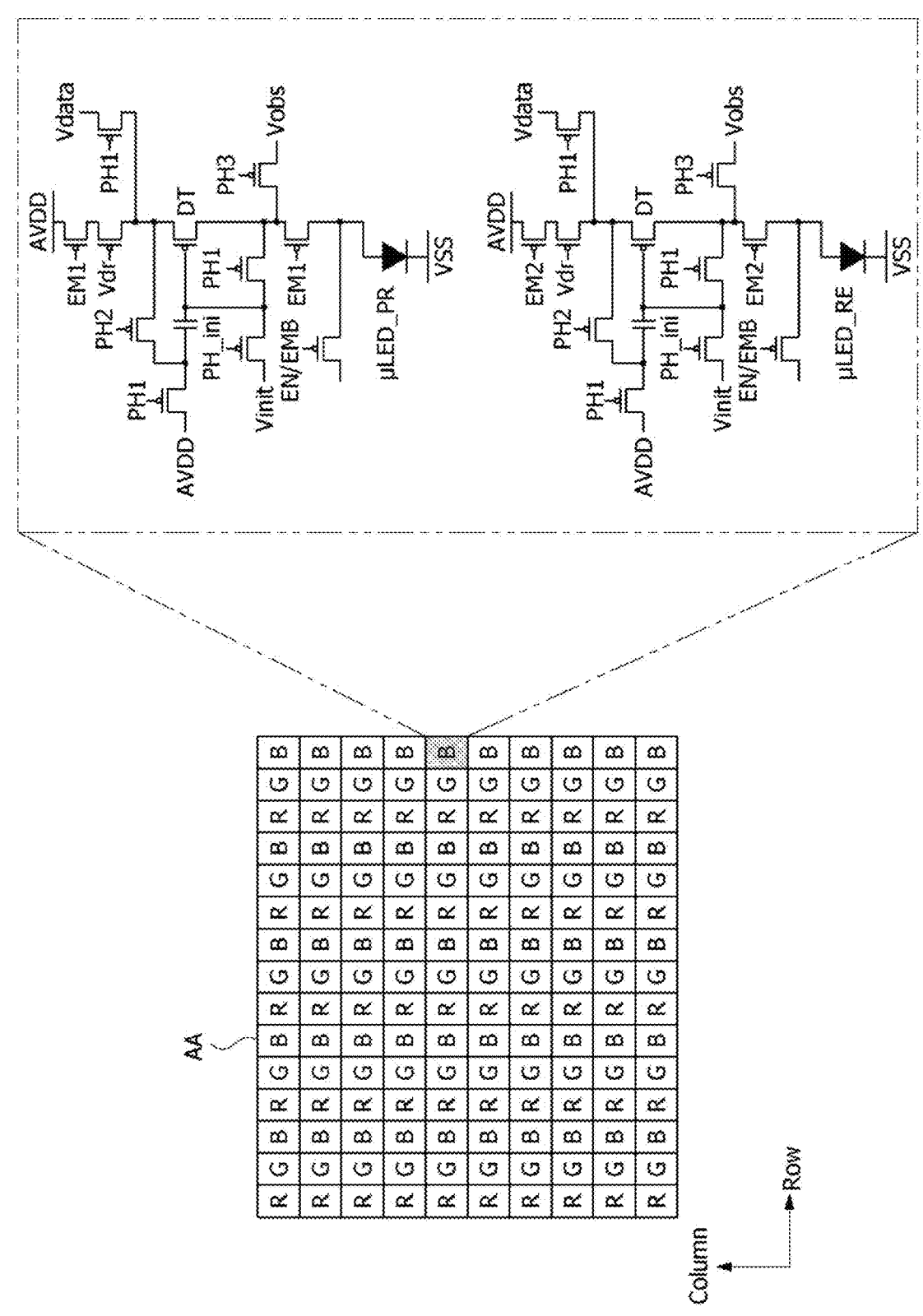
FIG. 11 is a diagram explaining the configuration of a display panel according to a first embodiment of the present disclosure.

FIG. 11 is a diagram explaining the configuration of a display panel according to a first embodiment of the present disclosure.

Referring to FIG. 11, in the display panel according to the first embodiment, one sub-pixel may include a main light-emitting element μLED_PR and a sub light-emitting element μLED_RE. The main light-emitting element μLED_PR may be driven by a first driving circuit, and the sub light-emitting element μLED_RE may be driven by a second driving circuit. Here, the first driving circuit may include a plurality of transistors that are driven by gate signals PH1, PH2, PH3, PH_ini, EM1, Vdr, and EN/EMB. Further, the second driving circuit may also include a plurality of transistors that are driven by gate signals PH1, PH2, PH3, PH_ini, EM2, Vdr, and EN/EMB. The main light-emitting element μLED_PR and the sub light-emitting element μLED_RE are micro LEDs that emit light of the same color wavelength.

In the first embodiment, in case that the main light-emitting element μLED_PR is normal, the gate signals PH1, PH2, PH3, PH_ini, EM1, Vdr, and EN/EMB, a data voltage Vdata, an initialization voltage Vinit, and a bias voltage Vobs may be supplied to the first driving circuit only, and the gate signals PH1, PH2, PH3, PH_ini, EM2, Vdr, and EN/EMB, the data voltage Vdata, the initialization voltage Vinit, and the bias voltage Vobs may not be supplied to the second driving circuit. Due to this, the sub light-emitting element μLED_RE may not be driven, and only the main light-emitting element μLED_PR may be driven.

Here, if the gate signals PH1, PH2, PH3, PH_ini, EM1, Vdr, and EN/EMB, the data voltage Vdata, the initialization voltage Vinit, and the bias voltage Vobs are supplied to the first driving circuit, a driving current may flow from a driving power line for supplying a driving voltage AVDD that is a high-potential voltage to a cathode power line for supplying a cathode voltage VSS that is a low-potential voltage. The main light-emitting element μLED_PR may be driven by the driving current as described above.

In the first embodiment, in case that the main light-emitting element μLED_PR is defective, the gate signals PH1, PH2, PH3, PH_ini, EM2, Vdr, and EN/EMB, the data voltage Vdata, the initialization voltage Vinit, and the bias voltage Vobs may be supplied to the second driving circuit only, and the gate signals PH1, PH2, PH3, PH_ini, EM1, Vdr, and EN/EMB, the data voltage Vdata, the initialization voltage Vinit, and the bias voltage Vobs may not be supplied to the first driving circuit. Due to this, the main light-emitting element μLED_PR may not be driven, and only the sub light-emitting element μLED_RE may be driven.

Here, if the gate signals PH1, PH2, PH3, PH_ini, EM2, Vdr, and EN/EMB, the data voltage Vdata, the initialization voltage Vinit, and the bias voltage Vobs are supplied to the second driving circuit, the driving current may flow from the driving power line for supplying the driving voltage AVDD that is the high-potential voltage to the cathode power line for supplying the cathode voltage VSS that is the low-potential voltage. The sub light-emitting element μLED_RE may be driven by the driving current as described above.

As described above, in the first embodiment, since the sub light-emitting element μLED_RE, which can be driven in replacement of the main light-emitting element μLED_PR in case that the main light-emitting element μLED_PR is defective, is disposed on the display panel, the display panel may be used without the separate repair process.

However, in the first embodiment, since the driving circuit is configured for each main light-emitting element μLED_PR and sub light-emitting element μLED_RE, the areas occupied by the driving circuits in the display panel are increased, and the number of components for configuring the driving circuits is also increased.

In the second embodiment of the present disclosure, in order to reduce the areas occupied by the driving circuits in the display panel and the number of components, one driving circuit may drive the plurality of light-emitting elements.

The detailed description thereof is as follows.

Figure 12:
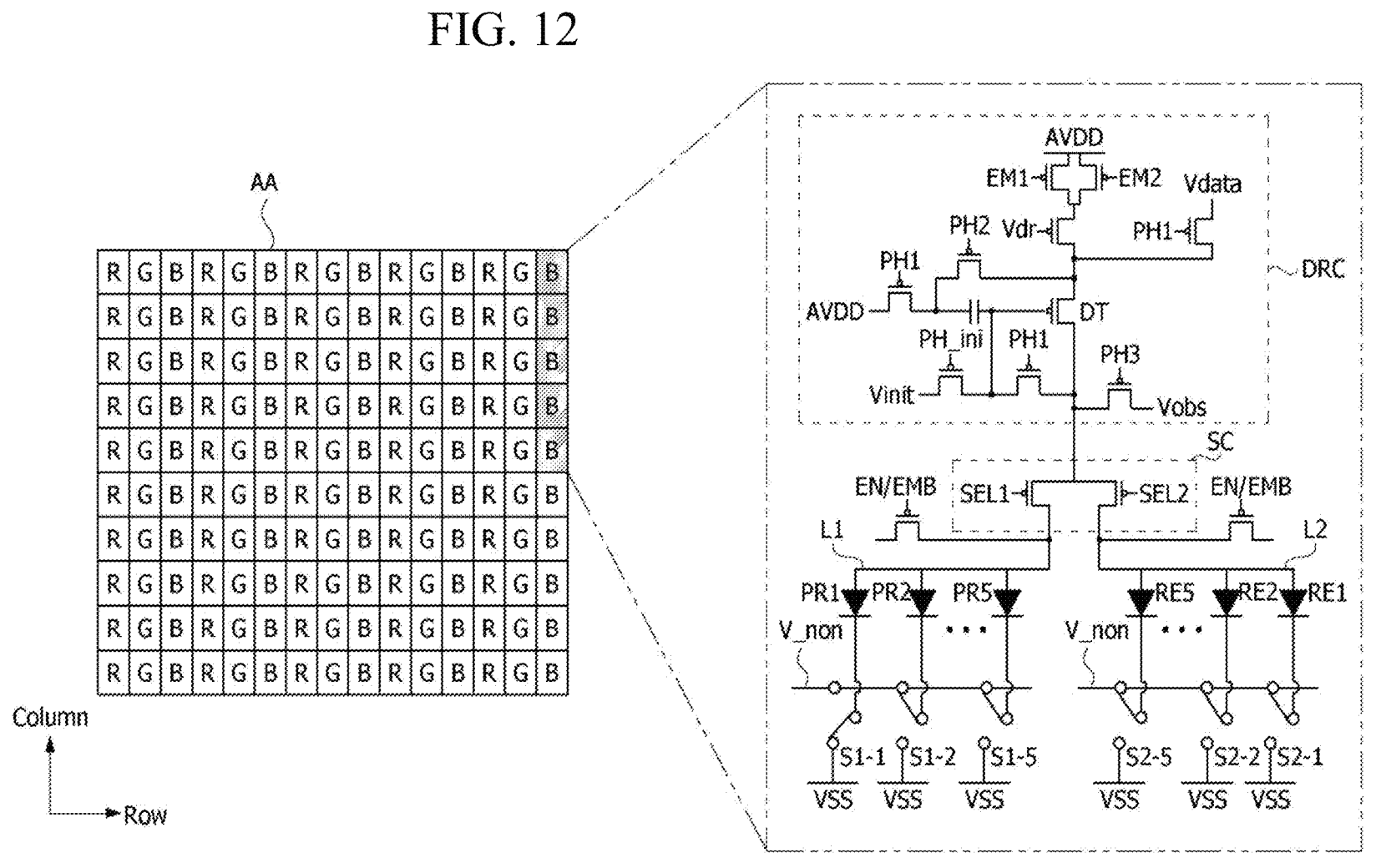

FIG. 12 is a diagram explaining the configuration of a display panel according to a second embodiment of the present disclosure.

Referring to FIG. 12, a plurality of sub-pixels disposed in a column direction of the display panel may be driven by one driving circuit DRC and one switch circuit SC. In other words, the display panel may include the driving circuit DRC and the switch circuit SC for driving a plurality of main light-emitting elements PR1 to PR5 and a plurality of sub light-emitting elements RE1 to RE5, which configure a plurality of sub-pixels.

Here, the first electrode of each of the plurality of main light-emitting elements PR1 to PR5 may be commonly connected to the first line L1, and may emit light of a first color wavelength. Further, the first electrode of each of the plurality of sub light-emitting elements RE1 to RE5 may be commonly connected to the second line L2, and may emit the light of the first color wavelength. The plurality of main light-emitting elements PR1 to PR5 and the plurality of sub light-emitting elements RE1 to RE5 may be micro LEDs. Here, the first electrode may mean the anode electrode of the light-emitting element, and the first color wavelength may be any one of a red wavelength, a blue wavelength, a green wavelength, and a white wavelength.

The driving circuit DRC may include a plurality of switch transistors that are driven by the gate signals PH1, PH2, PH3, PH_ini, EM1, EM2, Vdr, and EN/EMB. Further, the driving circuit DRC may include a driving transistor DT for driving the light-emitting elements.

The driving circuit DRC may generate current for driving the plurality of light-emitting elements PR1 to PR5. In other words, the driving circuit DRC may sequentially generate a first current for driving the first main light-emitting element PR1, a second current for driving the second main light-emitting element PR2, a third current for driving the third main light-emitting element (not illustrated), a fourth current for driving the fourth main light-emitting element (not illustrated), and a fifth current for driving the fifth main light-emitting element PR5.

In the second embodiment of the present disclosure, in case that the plurality of main light-emitting elements PR1 to PR5 are all normal, the first current to the fifth current may be sequentially transferred to the first line L1 by the switch circuit SC.

In case that any one of the plurality of main light-emitting elements PR1 to PR5 is defective, the current for driving the defect main light-emitting element may be transferred to the second line L2 by the switch circuit SC.

The switch circuit SC may include a first switch element that selectively connects the driving circuit DRC and the first line L1 to each other and a second switch element that selectively connects the driving circuit DRC and the second line L2 to each other. Here, the first switch element may be turned on by a first selection signal SEL1, and the second switch element may be turned on by a second selection signal SEL2.

For example, if the first main light-emitting element PR1 and the second main light-emitting element PR2 are normal, only the first switch is turned on by the first selection signal SEL1, and the driving circuit DRC and the first line L1 are electrically connected to each other. Due to this, the first current and the second current may be transferred to the first line L1.

If any one of the first main light-emitting element PR1 and the second main light-emitting element PR2 is defective, the second switch element is turned on by the second selection signal SEL2 at a driving time of the defective main light-emitting element, and the driving circuit DRC and the second line L2 are electrically connected to each other. Due to this, any one of the first current and the second current may be transferred to the second line L2.

Meanwhile, in the second embodiment, the display panel may further include: a first power line configured to supply a driving voltage AVDD that is a high-potential voltage to the driving circuit DRC; a second power line to which a cathode voltage that is a low-potential voltage which is lower than the driving voltage AVDD is applied; and a non-driving voltage line V_non to which a non-driving voltage that is set to be equal to or higher than the driving voltage is applied. Here, if the driving voltage is 2 V, the non-driving voltage may be equal to or higher than 2 V (e.g., 2.5 V).

Further, the display panel may further include a plurality of third switch elements S1-1 to S1-5 that connect the plurality of main light-emitting elements PR1 to PR5 to the second power line or the non-driving voltage line V_non.

The display panel may further include a plurality of fourth switch elements S2-1 to S2-5 that connect the plurality of sub light-emitting elements RE1 to RE5 to the second power line or the non-driving voltage line.

Figure 13:
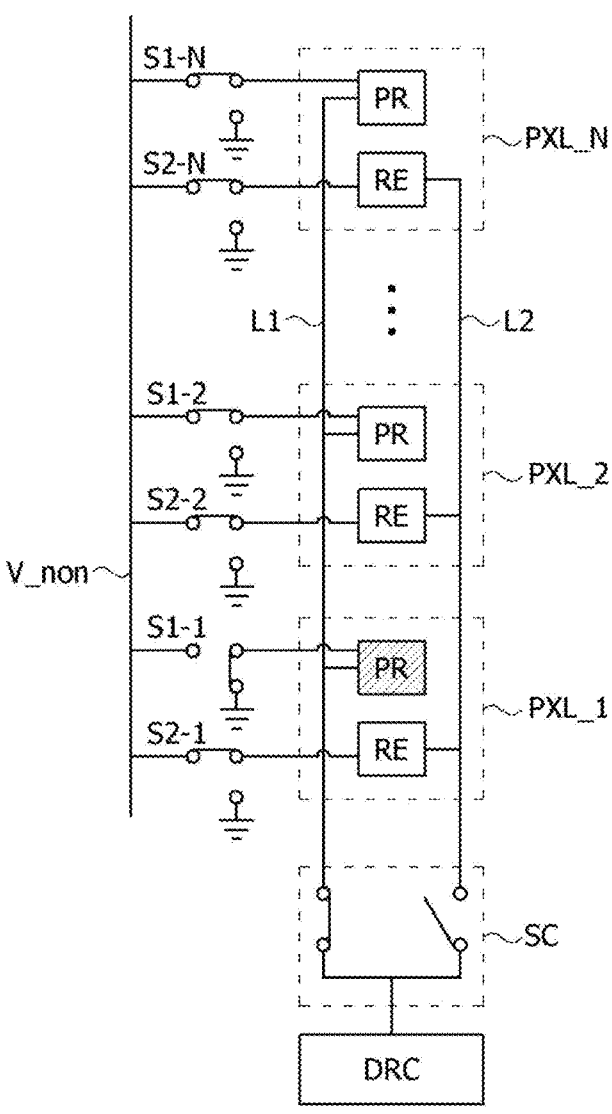
FIGS. 13 and 14 are diagrams explaining a driving method of a light-emitting element in a second embodiment of the present disclosure.

In the second embodiment, in case that the normal first main light-emitting element PR1 is driven by the first current in a state where only the first switch element of the switch circuit SC is turned on and the driving circuit DRC and the first line L1 are electrically connected to each other as in FIG. 13, the third switch element S1-1 disposed in the first main light-emitting element PR1 may connect the second electrode of the first main light-emitting element PR1 to the second power line (ground mark of FIG. 13), and the remaining third switch elements disposed in the remaining main light-emitting elements may connect the second electrode of each of the remaining main light-emitting elements to the non-driving voltage line V_non. Here, the second electrode may mean the cathode electrode of the light-emitting element.

In other words, in case that the normal first main light-emitting element PR1 is driven by the first current, the first main light-emitting element PR1 may be connected to the second power line, and the remaining main light-emitting elements may be connected to the non-driving voltage line V_non.

Here, a potential difference between the driving voltage AVDD and the cathode voltage, that is, a voltage obtained by subtracting the cathode voltage from the driving voltage AVDD, may be higher than a threshold voltage of the first main light-emitting element PR1. Accordingly, if the first main light-emitting element PR1 is connected to the cathode power line, the first current flows to the first main light-emitting element PR1.

In the second embodiment, since the non-driving voltage is set to be equal to or higher than the driving voltage AVDD, the voltage obtained by subtracting the driving voltage AVDD from the non-driving voltage may be lower than the threshold voltage of the remaining main light-emitting elements. Accordingly, if the remaining main light-emitting elements are connected to the non-driving voltage line V_non, the first current does not flow to the remaining main light-emitting elements.

In FIG. 13, if the second main light-emitting element PR2 is normal, the second current may flow to the second main light-emitting element PR2 by the above-described configuration, and the second driving current may not flow to the remaining main light-emitting elements.

Figure 14:
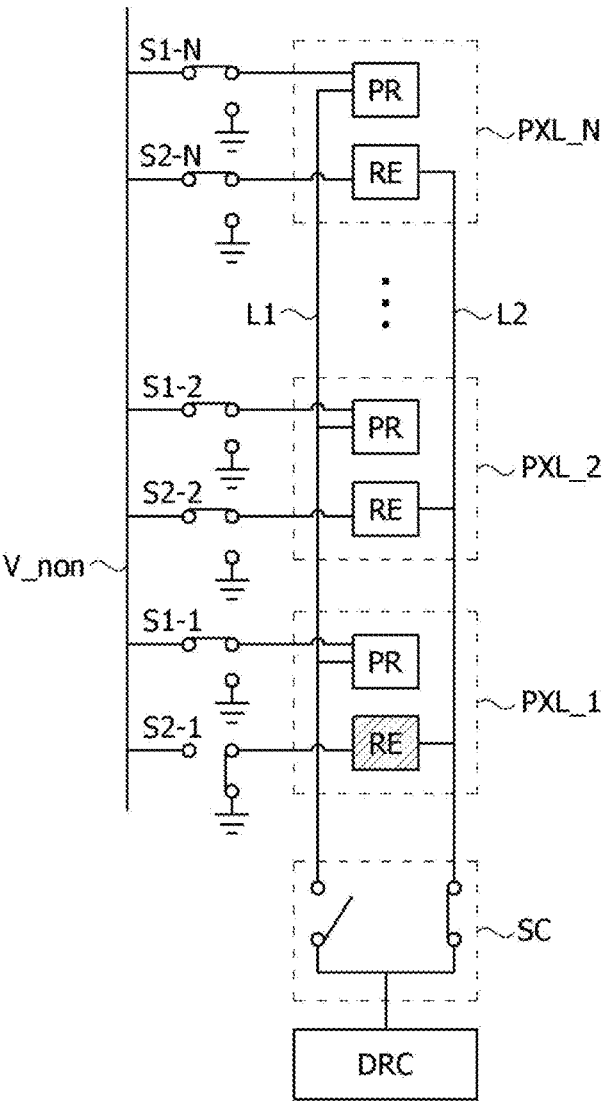

Meanwhile, in the second embodiment, in case that the first sub light-emitting element RE1 is driven by the first current in a state where only the second switch element of the switch circuit SC is turned on and the driving circuit DRC and the second line L2 are electrically connected to each other as in FIG. 14, the fourth switch element S2-1 disposed in the first sub light-emitting element RE1 may connect the second electrode of the first sub light-emitting element RE1 to the second power line, and the remaining fourth switch elements disposed in the remaining sub light-emitting elements may connect the second electrode of each of the remaining sub light-emitting elements to the non-driving voltage line V_non.

In other words, in case that the first sub light-emitting element RE1 that substitutes for the defect first main light-emitting element PR1 is driven by the first current, the first sub light-emitting element RE1 may be connected to the second power line, and the remaining sub light-emitting elements may be connected to the non-driving voltage line V_non.

Here, the potential difference between the driving voltage AVDD and the cathode voltage, that is, the voltage obtained by subtracting the cathode voltage from the driving voltage AVDD, may be higher than the threshold voltage of the first sub light-emitting element RE1. Accordingly, if the first sub light-emitting element RE1 is connected to the cathode power line, the first current flows to the first sub light-emitting element RE1.

In the second embodiment, since the non-driving voltage is set to be equal to or higher than the driving voltage AVDD, the voltage obtained by subtracting the driving voltage AVDD from the non-driving voltage may be lower than the threshold voltage of the remaining sub light-emitting elements. Accordingly, if the remaining sub light-emitting elements are connected to the non-driving voltage line V_non, the first current does not flow to the remaining sub light-emitting elements.

In FIG. 14, if the second main light-emitting element PR2 is also defective, the second current may flow to the second sub light-emitting element RE2 by the above-described configuration, and the second current may not flow to the remaining sub light-emitting elements.

As described above, in the second embodiment, one driving circuit DRC and one switch circuit SC can drive the sub-pixels disposed in the column direction, and thus the number of driving circuits in the display panel may be reduced. Due to this, the areas occupied by the driving circuits in the display panel and the number of components can be reduced. Here, the plurality of sub-pixels include the plurality of main light-emitting elements PR1 to PR5 and the plurality of sub light-emitting elements RE1 to RE5.

Figure 15:
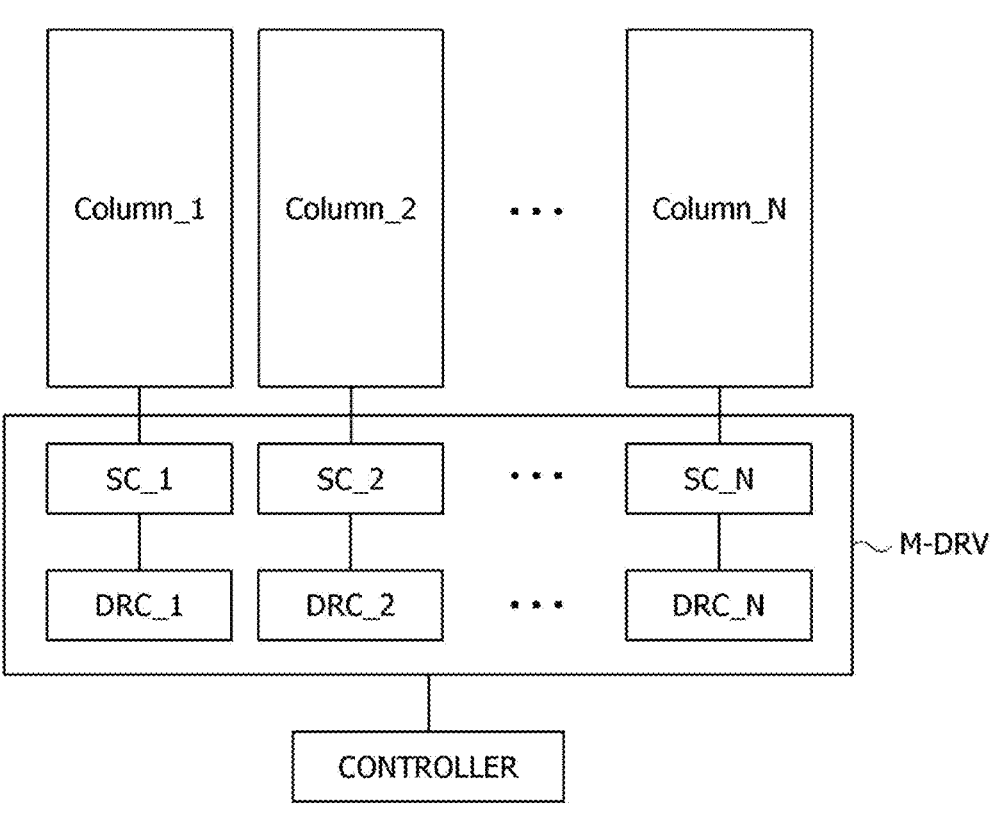
FIG. 15 is a diagram schematically illustrating the configuration of a micro driver in a second embodiment of the present disclosure.

In the second embodiment, as in FIG. 15, a micro driver M-DRV may include the plurality of driving circuits DRC_1 to DRC_N and a plurality of switch circuits SC_1 to SC_N. The plurality of driving circuits DRC_1 to DRC_N and the plurality of switch circuits SC_1 to SC_N may drive sub-pixels Column_1 to Column_N disposed in the column direction.

Here, switching timing of switch transistors included in the driving circuit DRC, switching timing of the third switch elements, switching timing of the fourth switch elements, and switching timing of the switch circuit SC may be controlled by a controller. Here, locations of the defect main light-emitting elements on the display panel may be stored in the form of map data by the controller, and the controller may control the switching timing of the switch circuit SC by using the map data. The controller may be disposed on an outside of the micro driver M-DRV as in FIG. 15. The controller may be built in the micro driver M-DRV.

Figure 16:
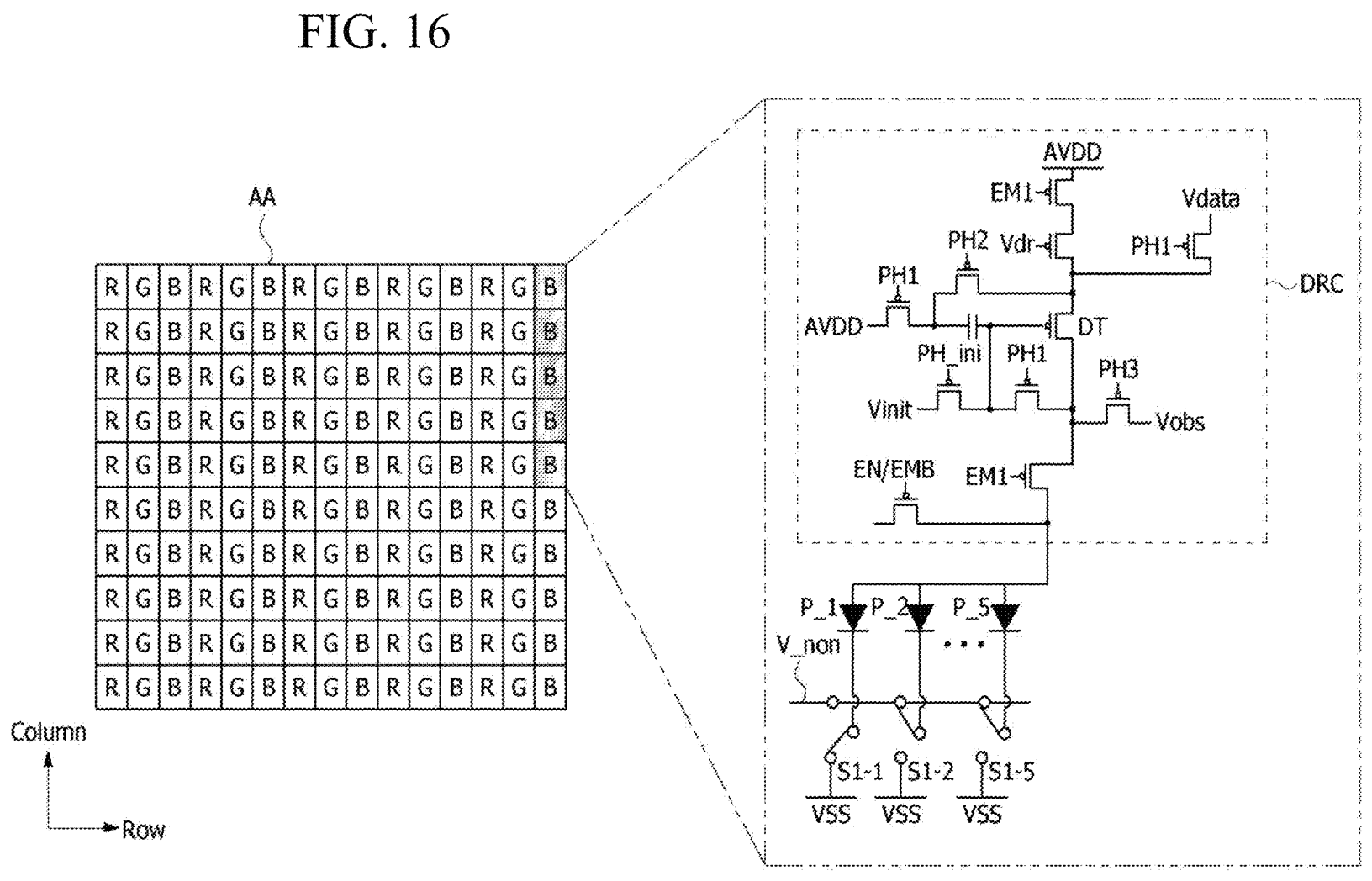

In the second embodiment, although it has been described that one driving circuit DRC and one switch circuit SC drive the plurality of main light-emitting elements PR1 to PR5 and the plurality of sub light-emitting elements RE1 to RE5, the present disclosure is not limited thereto, and as in FIG. 16, one driving circuit DRC may drive only the plurality of light-emitting elements P_1 to P_5.

FIG. 16 is a diagram explaining the configuration of a display panel according to a third embodiment of the present disclosure.

Referring to FIG. 16, a plurality of light-emitting elements P1 to P5 disposed in the column direction of the display panel may be driven by one driving circuit DRC. In other words, the display panel may include the driving circuit DRC for driving the plurality of light-emitting elements P_1 to P_5.

Here, the first electrode of each of the plurality of light-emitting elements P_1 to P_5 may be commonly connected to one line, and may emit light of a first color wavelength. The plurality of light-emitting elements P_1 to P_5 may be micro LEDs.

The driving circuit DRC may include a plurality of switch transistors that are driven by the gate signals PH1, PH2, PH3, PH_ini, EM1, Vdr, and EN/EMB. Further, the driving circuit DRC may also include a driving transistor DT for driving the light-emitting elements.

The driving circuit DRC may generate current for sequentially driving the plurality of light-emitting elements P_1 to P_5. In other words, the driving circuit DRC may sequentially generate a first current for driving the first light-emitting element P_1, a second current for driving the second light-emitting element P_2, a third current for driving the third light-emitting element (not illustrated), a fourth current for driving the fourth light-emitting element (not illustrated), and a fifth current for driving the fifth light-emitting element P_5.

Meanwhile, in the third embodiment, the display panel may further include: a first power line configured to supply a driving voltage AVDD that is a high-potential voltage to the driving circuit DRC; a second power line to which a cathode voltage that is a low-potential voltage which is lower than the driving voltage AVDD is applied; and a non-driving voltage line V_non to which a non-driving voltage that is set to be equal to or higher than the driving voltage AVDD is applied.

Further, the display panel may further include a plurality of third switch elements S1-1 to S1-5 that connect the plurality of light-emitting elements P_1 to P_5 to the second power line or the non-driving voltage line V_non.

Figure 17:
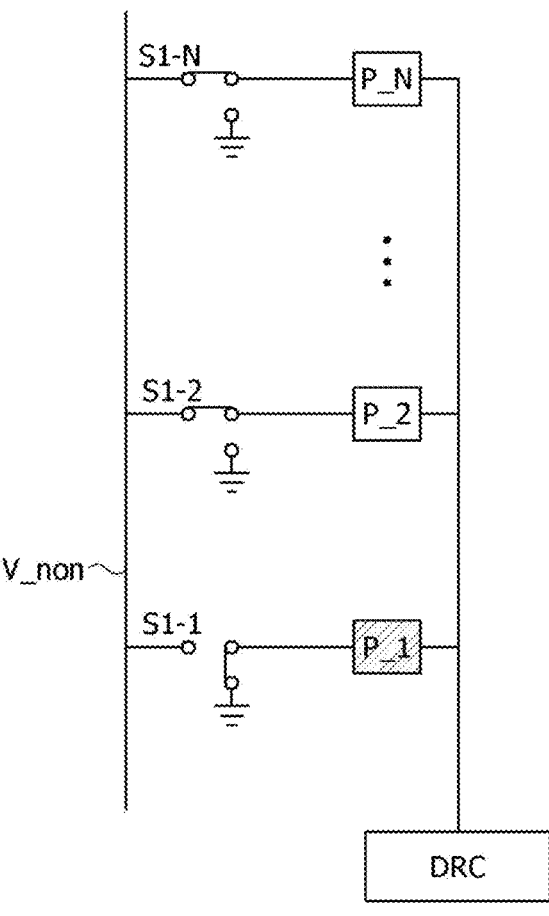
FIGS. 17 and 18 are diagrams explaining a driving method of a light-emitting element in a third embodiment of the present disclosure.

In the third embodiment, in case that the first light-emitting element P_1 is driven by the first current as in FIG. 17, the third switch element S1-1 disposed in the first light-emitting element P_1 may connect the second electrode of the first light-emitting element P_1 to the second power line (ground mark of FIG. 17), and the remaining third switch elements disposed in the remaining light-emitting elements may connect the remaining second electrode of each of the remaining light-emitting elements to the non-driving voltage line V_non.

In other words, in case that the first light-emitting element P_1 is driven by the first current, the first light-emitting element P_1 may be connected to the second power line, and the remaining light-emitting elements may be connected to the non-driving voltage line V_non.

Here, the potential difference between the driving voltage AVDD and the cathode voltage, that is, the voltage obtained by subtracting the cathode voltage from the driving voltage AVDD, may be higher than the threshold voltage of the first light-emitting element P_1. Accordingly, if the first light-emitting element P_1 is connected to the second power line, the first current flows to the first light-emitting element P_1.

In the third embodiment, since the non-driving voltage is set to be equal to or higher than the driving voltage AVDD, the voltage obtained by subtracting the driving voltage AVDD from the non-driving voltage may be lower than the threshold voltage of the remaining light-emitting elements. Accordingly, if the remaining light-emitting elements are connected to the non-driving voltage line V_non, the first current does not flow to the remaining light-emitting elements.

In FIG. 17, at the driving time of the second light-emitting element P_2, the second current may flow to the second light-emitting element P_2 by the above-described configuration, and the second current may not flow to the remaining light-emitting elements.

Figure 18:
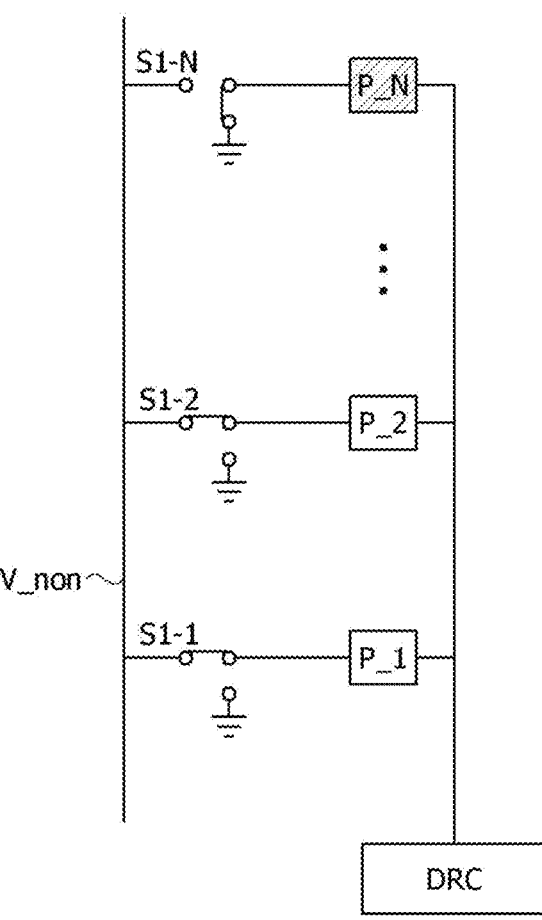

In other words, as in FIG. 18, the light-emitting elements P_1 to P_N may be sequentially driven by the above-described configuration.

As described above, in the third embodiment, one driving circuit DRC can drive the sub-pixels disposed in the column direction, and thus the number of driving circuits in the display panel may be reduced. Due to this, the areas occupied by the driving circuits in the display panel and the number of components may be reduced. Here, the plurality of sub-pixels include the plurality of light-emitting elements P_1 to P_5.

Figure 19:
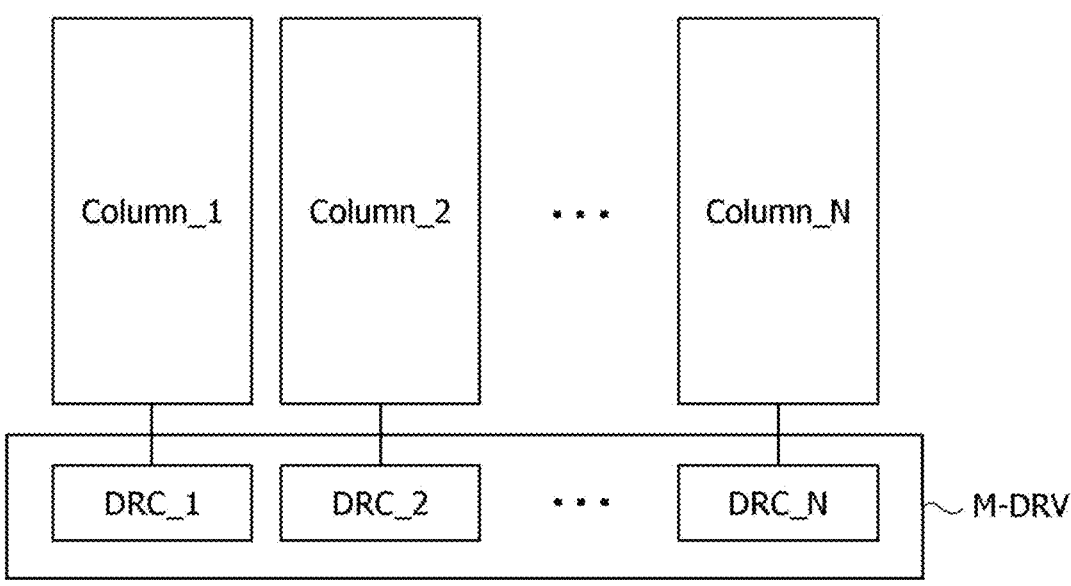
FIG. 19 is a diagram schematically illustrating the configuration of a micro driver in a third embodiment of the present disclosure.

In the third embodiment, the micro driver M-DRV may include a plurality of driving circuits DRC_1 to DRC_N as in FIG. 19. The plurality of driving circuits DRC_1 to DRC_N may drive the sub-pixels Column_1 to Column_N disposed in the column direction.

Effects of the present disclosure are not limited to those mentioned above, and other effects not mentioned will be clearly understood by those skilled in the art from the description below.

The embodiments of the present disclosure have been described in detail with reference to the accompanying drawings, but the present disclosure is not necessarily limited to the embodiments, and may be implemented in various modifications without departing from the spirit and scope of the present disclosure. Accordingly, the embodiments disclosed in the present disclosure are not intended to limit the scope of the present disclosure, but to explain the scope, and the scope of the spirit of the present disclosure is not limited by the embodiments. Therefore, it should be appreciated that the embodiments described above are intended to be illustrative in all respects and not restrictive. The scope of the present disclosure should be interpreted based on the accompanying claims, and all technical concepts within the scope equivalent to the claims should be construed as being included in the scope of the present disclosure.

What is claimed is:

1. A display panel, comprising:

a substrate;

a driving circuit disposed on the substrate;

a plurality of insulating layers covering the driving circuit;

an inorganic insulating material layer disposed on the plurality of insulating layers;

a bank pattern disposed on the inorganic insulating material layer;

a plurality of light-emitting elements disposed on the bank pattern;

a plurality of electrodes penetrating the plurality of insulating layers and electrically connecting the driving circuit and the plurality of light-emitting elements;

a second electrode disposed on the plurality of light-emitting elements; and a black matrix disposed on the second electrode, wherein the bank pattern is made of an organic insulating material and is configured to guide locations to which the plurality of light-emitting elements are attached in a transfer process, wherein the plurality of light-emitting elements comprise:

a plurality of main light-emitting elements, each having a first electrode connected to a first line; and a plurality of sub light-emitting elements, each having a first electrode connected to a second line, wherein the driving circuit is configured to generate current for driving one or more of the plurality of main light-emitting elements and one or more of the plurality of sub light-emitting elements, and wherein the display panel further comprises a switch circuit including a first switch element configured to selectively connect the driving circuit and the first line to each other and a second switch element configured to selectively connect the driving circuit and the second line to each other.

2. The display panel of claim 1, wherein when the plurality of main light-emitting elements are emitting light, the first switch element electrically connects the driving circuit and the first line to each other and transfers the current to the first line in response to a first selection signal that turns on the first switch element, and when any one of the plurality of main light-emitting elements fails to emit light, the second switch element electrically connects the driving circuit and the second line to each other and transfers the current to the second line in response to a second selection signal that turns on the second switch element at a driving time of the any one of the plurality of main light-emitting elements.

3. The display panel of claim 1, further comprising:

a first power line configured to supply a driving voltage to the driving circuit;

a second power line to which a cathode voltage that is lower than the driving voltage is for being applied;

a non-driving power line to which a non-driving voltage that is set to be equal to or higher than the driving voltage is for being applied;

a plurality of third switch elements configured to connect a second electrode of each of the main light-emitting elements to the second power line or to a non-driving voltage line; and a plurality of fourth switch elements configured to connect a second electrode of each of the sub light-emitting elements to the second power line or to the non-driving voltage line.

4. The display panel of claim 3, wherein the plurality of third switch elements comprise a third switch element and remaining third switch elements, and wherein in case that any one of the plurality of main light-emitting elements is driven by the current in a state where the first switch element electrically connects the driving circuit and the first line to each other, the third switch element disposed on the any one of the plurality of main light-emitting elements connects the second electrode of the any one of the plurality of main light-emitting elements to the second power line, and the remaining third switch elements disposed on the remaining main light-emitting elements connect the second electrode of each of the remaining main light-emitting elements to the non-driving voltage line.

5. The display panel of claim 4, wherein a voltage obtained by subtracting the driving voltage from the non-driving voltage is a voltage that is lower than a threshold voltage of each of the plurality of main light-emitting elements.

6. The display panel of claim 3, wherein the plurality of fourth switch elements comprise a fourth switch element and remaining fourth switch elements, and wherein in case that any one of the plurality of sub light-emitting elements is driven by the current in a state where the second switch element electrically connects the driving circuit and the second line to each other, the fourth switch element disposed on the any one of the plurality of sub light-emitting elements connects the second electrode of the any one of the plurality of sub light-emitting elements to the second power line, and the remaining fourth switch elements disposed on the remaining sub light-emitting elements connect the second electrode of each of the remaining sub light-emitting elements to the non-driving voltage line.

7. The display panel of claim 6, wherein a voltage obtained by subtracting the driving voltage from the non-driving voltage is a voltage that is lower than a threshold voltage of each of the plurality of sub light-emitting elements.

8. The display panel of claim 1, wherein the plurality of main light-emitting elements and the plurality of sub light-emitting elements are micro light-emitting diodes (LEDs) that are configured to emit light of a same color wavelength.

9. The display panel of claim 1, wherein the second electrode is electrically and commonly connected to the plurality of main light-emitting elements and the plurality of sub light-emitting elements.

10. The display panel of claim 1, wherein the black matrix is formed on the second electrode and between the plurality of main light-emitting elements and the plurality of sub light-emitting elements.

11. The display panel of claim 9, wherein a width between an upper surface and a lower surface of the black matrix formed in a region where the second electrode is in contact with an upper surface of a contact electrode is different from a width between an upper surface and a lower surface of the black matrix formed between the plurality of main light-emitting elements and the plurality of sub light-emitting elements.

12. The display panel of claim 1, wherein the plurality of insulating layers comprise:

a first insulating layer disposed on the driving circuit;

a second insulating layer disposed on the first insulating layer;

a third insulating layer disposed on the second insulating layer;

a fourth insulating layer disposed on the third insulating layer; and a fifth insulating layer disposed on the fourth insulating layer.

13. The display panel of claim 12, wherein each of the first, second, third, fourth and fifth insulating layers includes at least one wiring pattern and at least one contact hole.

\* \* \* \* \*